United States Patent [19]
Gowda et al.

[11] Patent Number: 5,920,274
[45] Date of Patent: Jul. 6, 1999

[54] IMAGE SENSOR EMPLOYING NON-UNIFORM A/D CONVERSION

[75] Inventors: Sudhir Muniswamy Gowda, Ossining, N.Y.; Hyun Jong Shin, Ridgefield, Conn.; Hon-Sum Philip Wong, Chappaqua, N.Y.; Peter Hong Xiao, San Jose, Calif.; Jungwook Yang, West Nyack, N.Y.

[73] Assignee: International Business Machines Corporation, Armonk, N.Y.

[21] Appl. No.: 08/906,595

[22] Filed: Aug. 5, 1997

[51] Int. Cl.[6] ...................................................... H03M 1/12
[52] U.S. Cl. ............................................................. 341/155
[58] Field of Search .................................... 341/155, 138, 341/118, 120, 159, 161

[56] References Cited

U.S. PATENT DOCUMENTS 5,610,604  3/1997  Leacock et al. .......................... 341/138

*Primary Examiner*—Brian Young

[57] ABSTRACT

Disclosed is an image sensor having A/D conversion circuitry coupled to column data lines of an image sensor array. The A/D conversion circuitry digitizes analog signals on the column data lines, each representing intensity of light incident upon an active imager cell. Higher resolution is provided for darker light levels than for bright light levels, such that a high resolution image is obtained with less storage data than would otherwise be required. In one embodiment, the A/D conversion circuitry includes a plurality of comparators, each having a first input coupled to one or more column data lines and a second input coupled to receive a time-varying reference signal, and a plurality of n-bit counters coupled to the comparator outputs. An n-bit to m-bit converter nonlinearly maps n-bit codes to m-bit codes and provides the m-bit codes to an m-bit D/A converter which produces the time-varying reference signal. In another embodiment, the A/D conversion circuitry is comprised of a non-uniform successive approximation A/D converter.

20 Claims, 14 Drawing Sheets

| 8 BIT COUNTER OUTPUT | 8 BIT TO 10 BIT CONVERTER OUTPUT | VREF (mV) | |
|---|---|---|---|
| 0 0 0 0 0 0 0 0 | 0 0 0 0 0 0 0 0 0 0 | 511.5 | ⎫ |
| 0 0 0 0 0 0 0 1 | 0 0 0 0 0 0 0 0 0 1 | 511.0 | ⎬ ← STEP SIZE = 0.5 mV |
| 0 0 0 0 0 0 1 0 | 0 0 0 0 0 0 0 0 1 0 | 510.5 | |
| 0 0 0 0 0 0 1 1 | 0 0 0 0 0 0 0 0 1 1 | 510.0 | |
| ⋮ | ⋮ | ⋮ | |
| 1 1 1 1 1 1 0 1 | 1 1 1 1 1 1 1 0 0 1 | 6.0 | |
| 1 1 1 1 1 1 1 0 | 1 1 1 1 1 1 1 1 0 0 | 3.0 | ⎫ |
| 1 1 1 1 1 1 1 1 | 1 1 1 1 1 1 1 1 1 1 | 0.0 | ⎬ ← STEP SIZE = 3 mV |

$C_{MAX}$

| OUTPUT VALUE OF 10 BIT COUNTER | OUTPUT VALUE OF 10b-8b CONVERTER | CORRESPONDING VREF (mV) |
|---|---|---|
| 0 0 0 0 0 0 0 0 0 0 | 0 0 0 0 0 0 0 0 | 511.5 |
| 0 0 0 0 0 0 0 0 0 1 | 0 0 0 0 0 0 0 1 | 511.0 |
| 0 0 0 0 0 0 0 0 1 0 | 0 0 0 0 0 0 1 0 | 510.5 |
| 0 0 0 0 0 0 0 0 1 1 | 0 0 0 0 0 0 1 1 | 510.0 |
| ⋮ | ⋮ | ⋮ |
| 1 1 1 1 1 1 1 0 0 0 | 1 1 1 1 1 1 1 0 | 0.5 |
| 1 1 1 1 1 1 1 0 0 1 | 1 1 1 1 1 1 1 0 | 0.5 |
| 1 1 1 1 1 1 1 0 1 0 | 1 1 1 1 1 1 1 1 | 0.0 |
| 1 1 1 1 1 1 1 0 1 1 | 1 1 1 1 1 1 1 1 | 0.0 |
| 1 1 1 1 1 1 1 1 0 0 | 1 1 1 1 1 1 1 1 | 0.0 |
| 1 1 1 1 1 1 1 1 0 1 | 1 1 1 1 1 1 1 1 | 0.0 |
| 1 1 1 1 1 1 1 1 1 0 | 1 1 1 1 1 1 1 1 | 0.0 |
| 1 1 1 1 1 1 1 1 1 1 | 1 1 1 1 1 1 1 1 | 0.0 |

# IMAGE SENSOR EMPLOYING NON-UNIFORM A/D CONVERSION

FIELD OF THE INVENTION

This invention relates generally to image sensors such as complementary metal oxide semiconductor (CMOS) imagers. More specifically, this invention relates to an image sensor including non-uniform A/D conversion circuitry.

BACKGROUND

Recently, CMOS image sensors have been recognized as a viable candidate for image input devices. These sensors can be widely used in diverse applications such as in teleconferencing, robotics, machine vision and security surveillance. A major advantage of CMOS image sensors (or imagers) is that signal processing circuits can be readily integrated on the same chip as the imager, thus enabling the design of smart, single-chip image acquisition systems. CMOS imagers are also inherently lower cost than conventional charge coupled devices (CCDs) because they can be manufactured in conventional, widespread CMOS fabrication lines without any process modification.

FIG. 1 schematically illustrates one example of prior art active-pixel CMOS imager circuitry. Imager 10 is single-stage image sensor as disclosed in an article by Mendis et al., entitled "A 128×128 CMOS Active Pixel Image Sensor for Highly Integrated Imaging Systems", IEEE Electron Devices Meeting, p. 583, 1993. A MOS photogate 6 is employed as the light sensitive element in each pixel (imager cell) 18. The transistors within each pixel 18 are typically NMOSFETS due to technology considerations. The overall imager 10 is considered a CMOS imager since CMOS electronics are used in conjunction with the imager cells. For example, the transistors 3 within readout circuit 31 are typically PMOSFETS. As shown in the simplified block diagram of FIG. 2, imager 10 includes a plurality of such cells 18 arranged in an array of rows $R_1$-$R_M$ and columns $C_1$-$C_N$. Typically, only one row at a time is activated for image charge readout from all the cells 18 in that row. Timing and control logic 14 provides row select signals (VROW) on row select lines $RSL_1$-$RSL_M$ to select the active row. RESET pulses on lines $RES_1$ to $RES_M$ are also generated by logic block 14 for application to cells 18. The light-induced charge from each activated cell is read out as a corresponding voltage on one of column data lines $15_1$ to $15_N$, each of which is connected to the cells 18 in respective columns $C_1$ to $C_N$. The voltage on each line $15_i$ corresponds, at any given time, to the image charge of only one activated cell in the associated column $C_i$ and activated row. Readout circuits $31_1$ to $31_N$ read out the voltage of the activated cell in the corresponding column $C_1$-$C_N$. A load transistor 28 is utilized on each column bus. Capacitance Cc represents the bus line capacitance. Bus lines $19_1$ to $19_M$ carry voltages VDD, $V_{PG}$ and $V_{TX}$ to the respective cells 18. Processing/image storage electronics 16 receives the voltages from the readout circuits for storage in memory and subsequent processing and display. Logic blocks 14 and 16, which are clock synchronized, include CMOS electronics.

As shown in FIG. 1, within each cell 18, photo-charge "q" collected under photogate transistor 6 is transferred through a dc-biased transfer gate transistor 8 to a floating diffusion diode 7 formed beneath substrate surface 9. This floating diode 7 is periodically dc-restored by the application of a logic high RESET pulse to the gate of reset FET 11, thus resetting the potential of diode 7 (i.e., at circuit node 17) to a voltage (VDD–$V_{th}$) determined by the threshold voltage $V_{th}$ of FET 11 and the power supply voltage (VDD). Following each diode reset cycle, the photo-charge is transferred to floating diode 7. The voltage on diode 7 then corresponds to the intensity of light that was incident upon the associated imager cell 18 before the transfer step. This voltage sets the potential of the gate of source follower FET 13, which amplifies or buffers the voltage appearing at its gate terminal for subsequent readout. When row select transistor 12 is turned ON by a VROW pulse on row select line RSL, the voltage at circuit node 17 is detected by readout circuit 31 detecting corresponding voltage on column bus 15.

The reset noise may be removed by a variation of the correlated double sampling (CDS) technique as disclosed in an article by White et al., entitled "Characterization of Surface Channel CCD Image Arrays at Low Light Levels", IEEE Journal of Solid State Circuits, vol. SC-9, p.1, 1974. When used in CMOS image sensors, this correlated double sampling technique effectively removes the fixed pattern noise of the image sensor arising from offset errors due to transistor mismatches in manufacturing. To remove reset noise of reset switch 11, the reset level measured on column bus 15 is subtracted from the signal level on the column bus, where the reset level is obtained just prior to the transfer of photo-charge to diode 7. As such, any offset errors due to transistor mismatches are canceled since both levels are measured at the same circuit point. In the embodiment of Mendis et al., the reset level and the signal level are stored on two separate sample and hold capacitors CR and CS, via two separate switches S1 and S2, respectively. Two identical readout circuit portions are required, one for the reset level, and one for the signal level. Further differential amplification at the multiplexed column output (within circuit block 16) is required to complete the reset noise removal operation.

One drawback of the Mendis-type imager 10 of FIGS. 1 and 2 is that the CDS operation is performed in the analog domain, using capacitors CR and CS to temporarily store the reset and signal samples, respectively. These analog circuits are susceptible to noise and gain errors, reducing the accuracy of the image data. In addition, the capacitor CR used to store the reset sample must have a large area to minimize noise. Further, since there are separate paths for the reset and signal samples, mismatches in the two paths are not corrected. Instead, the mismatches are propagated. Accordingly, there is a need to overcome these deficiencies.

SUMMARY

The present disclosure is directed to an image sensor having A/D conversion circuitry coupled to column data lines of an image sensor array. The A/D conversion circuitry digitizes analog signals on the column data lines, where each analog signal represents intensity of light incident upon an active imager cell. Recognizing that human eyes are more sensitive to dark light level changes than to bright light level changes, so that more levels of light can be distinguished in darker light conditions, the present invention performs the A/D conversion in a non-uniform manner. Higher resolution is provided for darker light levels than for bright light levels, such that a high resolution image is obtained with less storage data than would otherwise be required.

In one embodiment, the analog to digital conversion circuitry includes a plurality of comparators, each having a first input coupled to one or more column data lines, and a second input that receives a time varying reference signal. An "n-bit" counter is coupled to an output of each comparator. An n-bit to m-bit converter (m>n) receives an n-bit count from an n-bit main counter which is clock synchronized with the other n-bit counters. The converter nonlinearly maps n-bit codes of the main counter to m-bit codes. An m-bit D/A converter converts the m-bit codes to the time-varying reference signal applied to the comparators. When the time varying reference signal approximately equals the signal input to any given comparator, the n-bit counter coupled to that comparator latches at the last count, whereby the signal amplitude corresponds to the latched count. The mapping within the n-bit to m-bit converter is such as to provide higher resolution for signals corresponding to dark light levels than for bright light levels. The n-bit counters coupled to the comparators may be up/down counters, whereby efficient correlated double sampling can be performed.

In a second embodiment, m-bit A/D conversion is performed to convert the analog signals on each column data line to m-bit digital data. The data are then multiplexed and applied to a m-bit to n-bit converter (m>n) which has a nonlinear mapping function to obtain higher resolution for data corresponding to dark light levels than for bright light levels.

In another embodiment, the analog to digital conversion circuitry is comprised of a non-uniform, successive approximation A/D converter, in which finer approximation windows are realized for signals corresponding to darker light levels. A multiplexer may be used to multiplex the column data lines, whereby a single comparator can be used to provide all the comparisons for the non-uniform conversion.

BRIEF DESCRIPTION OF THE DRAWINGS

Preferred embodiments of the present invention are described herein with reference to the drawings, in which like reference numerals identify similar or identical components throughout the several figures, wherein.

DETAILED DESCRIPTION OF THE PREFERRED EMBODIMENTS

Figure 1:
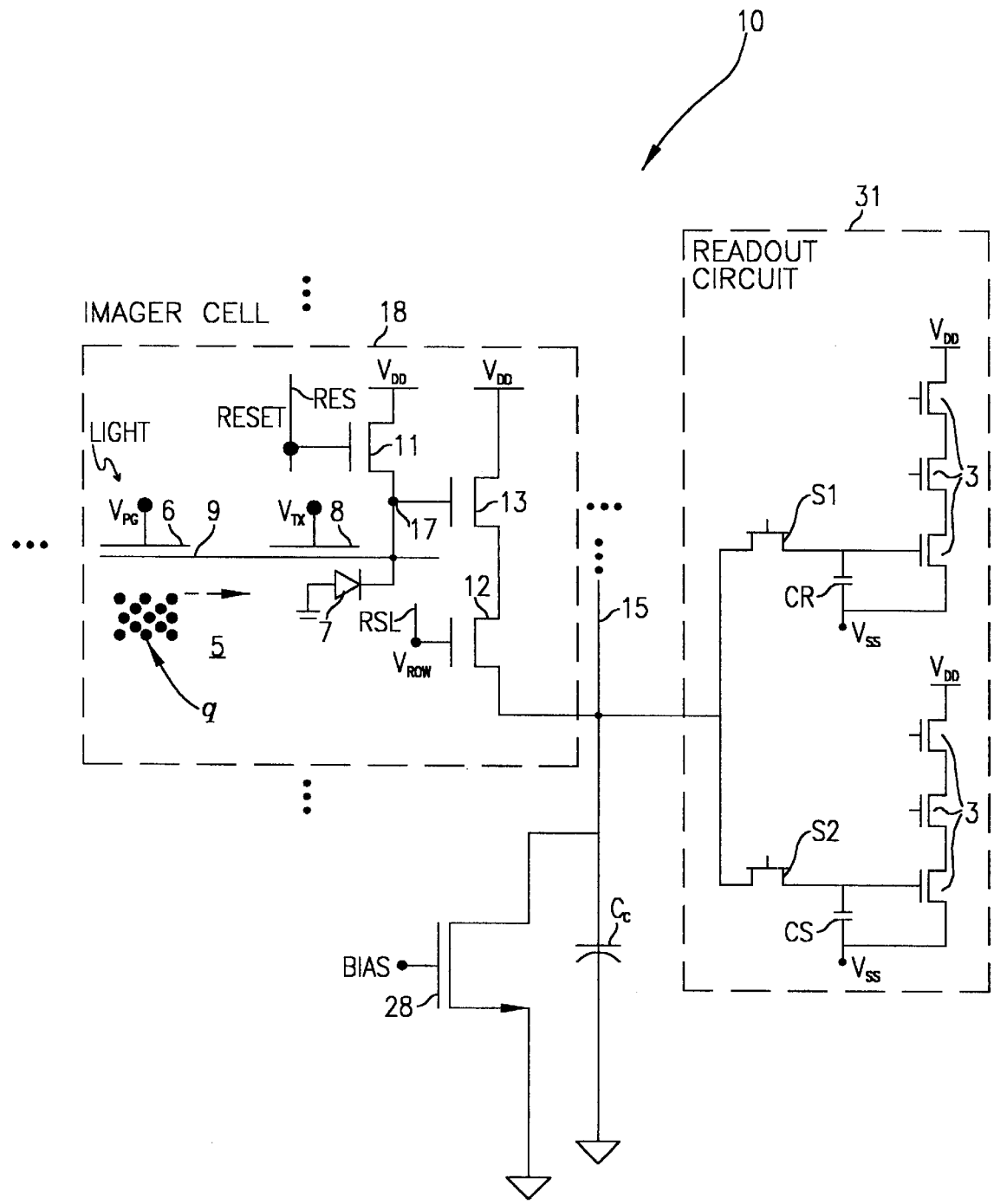
FIG. 1 schematically illustrates a prior art image sensor and pixel circuit.
Figure 2:
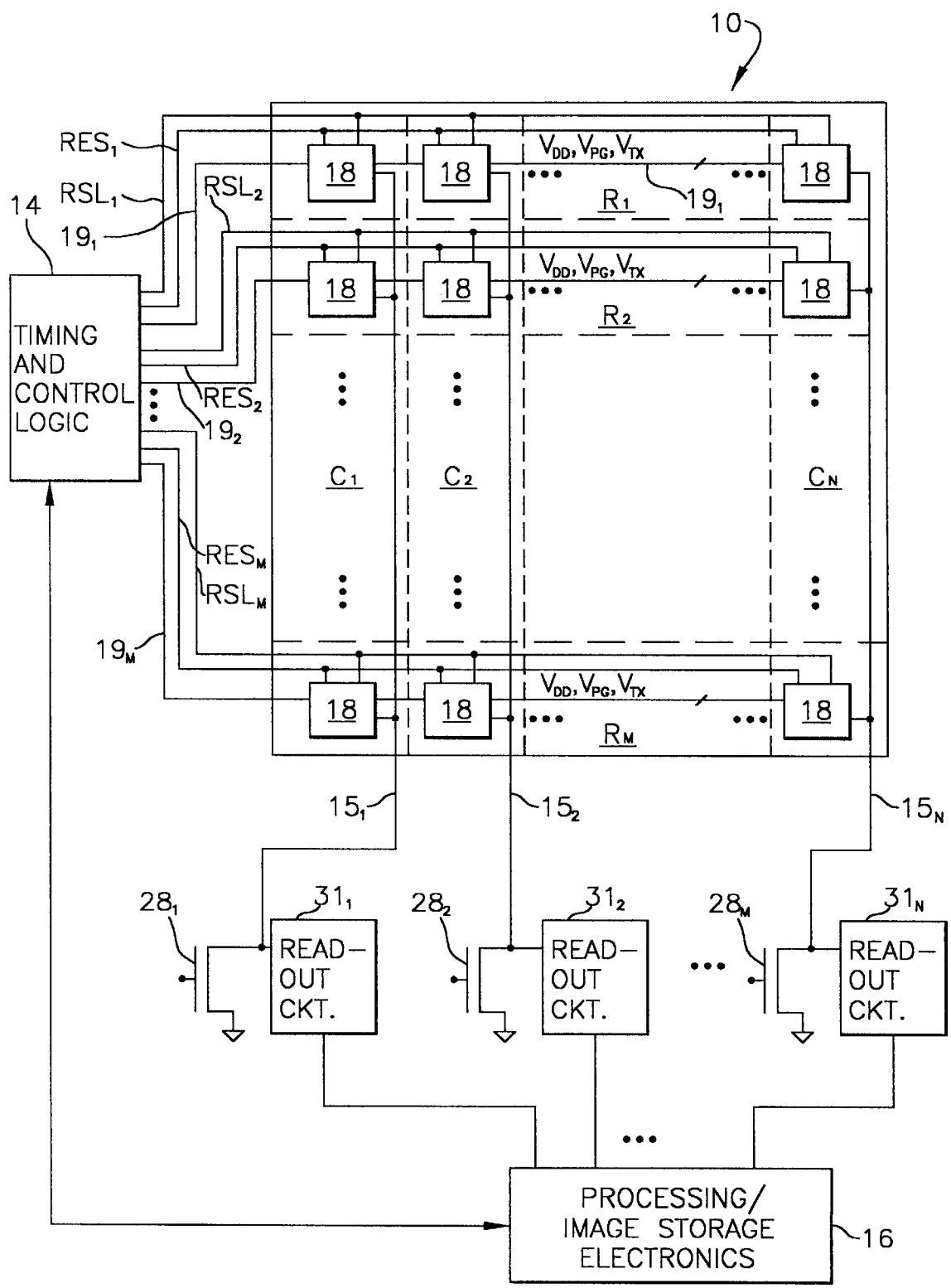
FIG. 2 is a schematic block diagram of a prior art image sensor including a sensor array and associated electronics.

As discussed above, prior art CMOS image sensors typically utilize a pair of analog capacitors to store reset and signal samples. The analog samples are applied to a differential amplifier which produces an output proportional to the voltage difference between the two samples. The analog capacitors, however, add noise to the signal samples, thus diminishing image data accuracy. One way of improving image data accuracy relative to the analog approach is to perform correlated double sampling entirely in the digital domain, as described in our co-pending U.S. Pat. application Ser. No. 08/876,694, filed Jun. 12, 1997, entitled IMAGE SENSOR WITH DIRECT DIGITAL CORRELATED DOUBLE SAMPLING, by S. Gowda et al., assigned to the assignee herein and incorporated herein by reference. In that patent application, an embodiment is described in which an analog to digital (A/D) converter is connected directly to each column data line at the bottom of each column. The A/D converter directly converts the reset sample on the column data line to a first digital codeword and outputs the codeword to a register for temporary storage. The register transfers the first codeword to signal processing circuitry for a subsequent operation. The A/D converter then converts the signal sample to a second digital codeword, where the level of the signal sample relative to the reset level corresponds to the amount of light incident upon the pixel cell. The second digital sample is then transferred to the register for subsequent transfer to the signal processing circuitry. The signal processing circuitry subtracts the reset level from the signal level (or vice versa) to obtain an image datum with the reset level and associated noise removed.

Another approach to eliminating the drawbacks of the analog capacitor storage technique is disclosed in our co-pending U.S. Pat. application Ser. No. 08/873,537, filed Jun. 12, 1997, entitled CORRELATED DOUBLE SAMPLING WITH UP/DOWN COUNTER, by S. Gowda et al., assigned to the assignee herein and incorporated herein by reference. That patent application describes a circuit for performing correlated double sampling entirely in the digital domain. The column data lines of an image sensor array are each directly connected to an input terminal of an associated comparator. The other input of each comparator receives a time varying input signal, and each comparator output is coupled to an up/down counter. During a first sampling interval in which a reset level is sampled, each up/down counter counts in a first direction, and stops counting when the time varying reference signal approximately equals the reset signal on the respective column data line. During a second sampling interval in which a signal level on the column data line, indicative of light intensity upon an active imager cell, is sampled, each up/down counter counts in an opposite direction. When the signal level approximately equals the time varying reference signal, the counter stops counting, whereby the final count equals the signal level minus the reset level, thus automatically completing the correlated double sampling operation. This approach eliminates the need for separately transferring out reset and signal samples for each image datum.

The present invention provides improved image resolution over the above-described digital approaches, for a given number of bits per image datum and for a given memory storage size. Recognizing that human eyes are more sensitive to dark light than to bright light, such that more levels of light can be distinguished in darker light conditions, the present invention performs the A/D conversion in a non-uniform manner. Higher resolution is obtained for dark levels by assigning more bits to dark levels than for bright levels. Thus, the electrical signal corresponding to the dark light is expanded while that for the bright light is compressed. The non-uniform resolution can be implemented using several different approaches which will now be described in detail.

Figure 3:
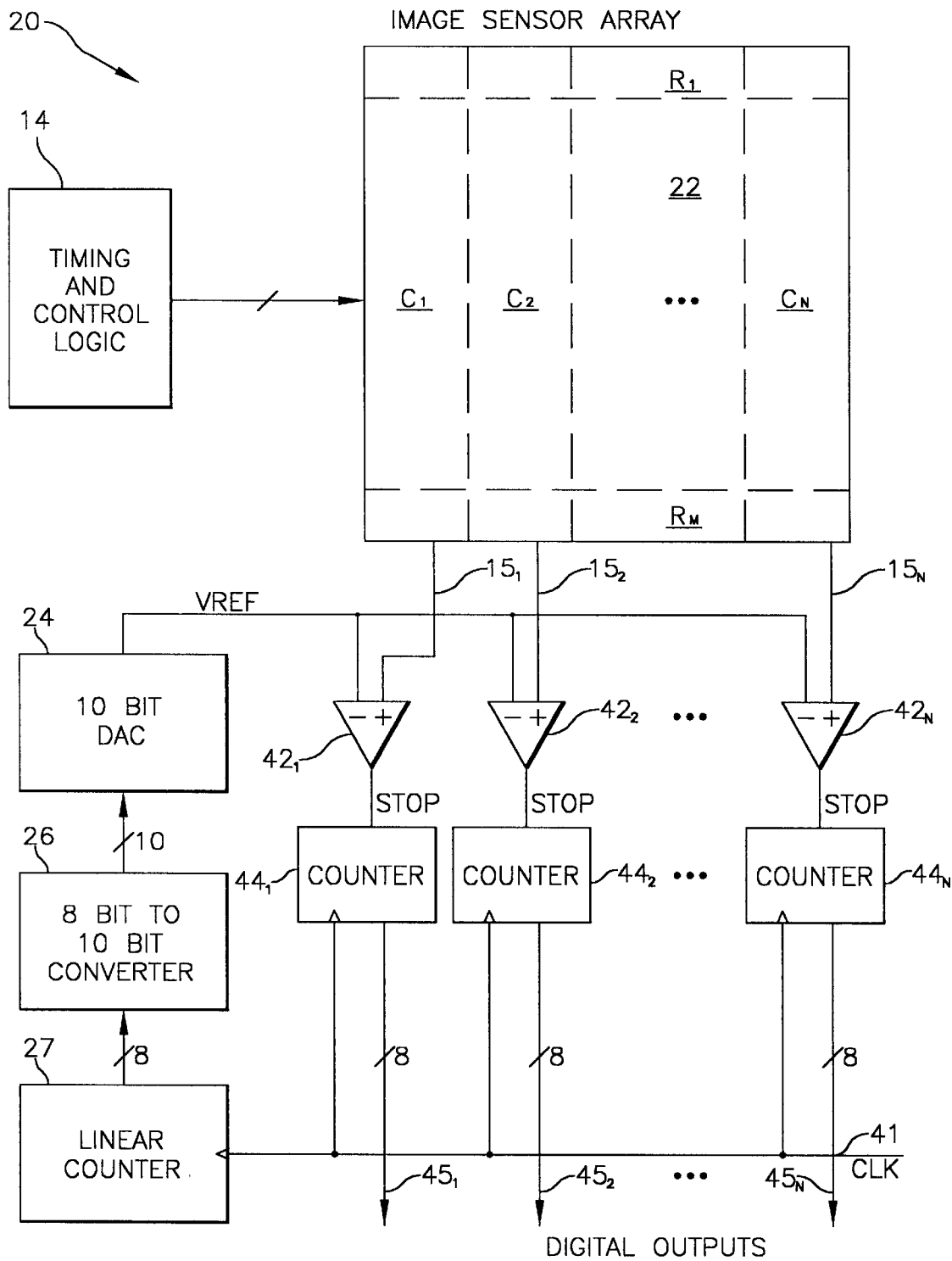
FIG. 3 is a schematic block diagram of an image sensor in accordance with a first embodiment of the present invention.

Referring now to FIG. 3, there is shown a simplified block diagram of an image sensor 20, which is a first embodiment of the present invention. Image sensor 20 includes an image sensor array 22 having imager cells (pixels) arranged in M rows $R_1$-$R_M$ and N columns $C_1$-$C_N$, with column data lines $15_1$-$15_N$ coupled to the imager cells of each column as described previously. Analog image data is read out row by row and provided on the column data lines under the control of timing and control logic 14. A/D conversion circuitry comprised of comparators $42_1$-$42_N$, counters $44_1$-$44_N$, a linear counter 27 (e.g., an 8-bit counter), an 8 bit to 10 bit converter 26 and a 10 bit D/A converter 24, operate together to digitize the image data on the column data lines to provide digitized outputs on lines $45_1$-$45_N$.

In operation, all the counters are reset to zero prior to reading image data from the pixels of a given row. Clock pulses from clock line 41 are then applied to counters $44_1$-$44_N$ as well as to counter 27. Counters $44_1$-$44_N$ are designed to have the same number of bits as counter 27, which in the exemplary embodiment is 8 bits. More or less bits may alternatively be used. The output count of counter 27 is applied to 8 bit to 10 bit converter 26, which provides a 10 bit output code based on a nonlinear mapping of the input code. The 10 bit output code is applied to D/A converter (DAC) 24, which produces a corresponding output voltage VREF. As an alternative, a DAC that produces a current output rather than an output voltage can be employed for DAC 24. The transfer characteristic of DAC 24 is preferably as shown in FIG. 4C, i.e., the analog output is an inverse linear function of the 10 bit digital input code. As such, an all zeroes input count produces a maximum analog output while an all ones input count produces a minimum analog output.

During a row sampling interval in which image data from the pixels of an active row are sampled, VREF is caused to ramp nonlinearly within a predetermined range as the linear counter 27 counts from a minimum to a maximum count. For any column $C_i$, as soon as the voltage on the corresponding data line $15_i$ is higher than VREF (for a downwardly ramping VREF) a STOP signal output of comparator $42_i$ changes from a logic low to a logic high. This causes counter $44_i$ to cease counting, whereby the last count corresponds to the amount of light incident upon the active pixel in the column. If correlated double sampling (CDS) is employed as is preferred, sampling is performed in two sampling windows within each row sampling interval. A preferred CDS approach will be discussed in further detail below.

Figures 4A, 4B:
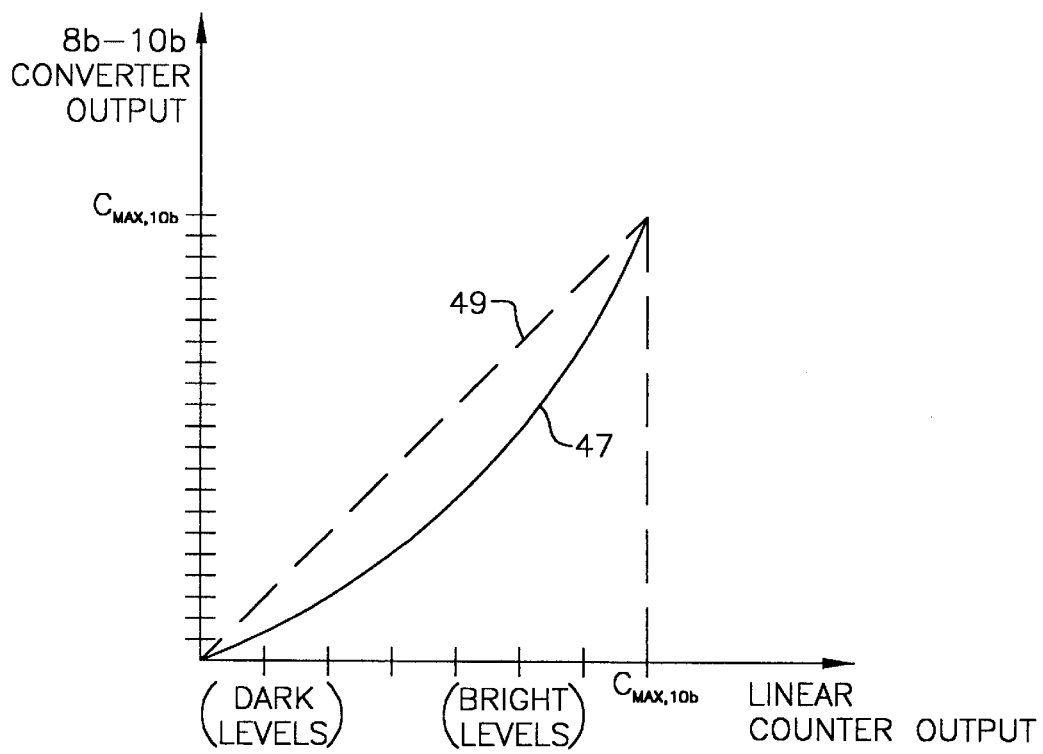
FIGS. 4A and 4B illustrate a transfer function of a low bit to high bit converter used in the image sensor of FIG. 1.
Figure 4C:
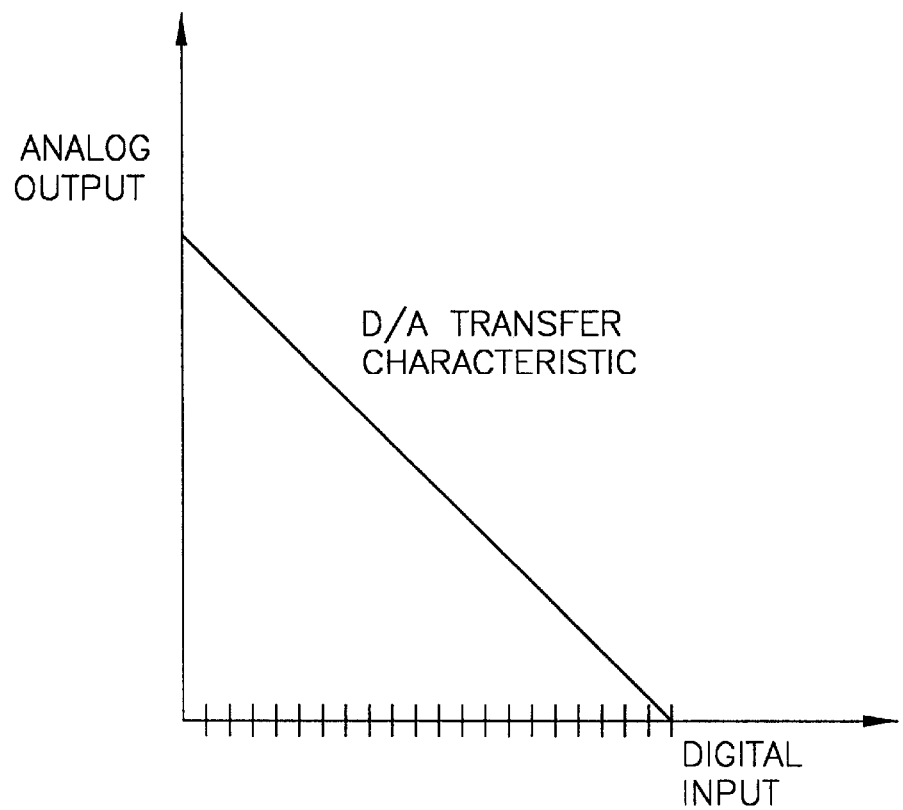
FIG. 4C illustrates an exemplary D/A converter transfer characteristic.

Bit converter 26 includes a storage device such as ROM or RAM that contains a nonlinear mapping lookup table as illustrated in FIGS. 4A and 4B. FIG. 4A is a graph showing an exemplary mapping function 47 of converter 27. Curve 49 is a linear function shown for comparison purposes, drawn to a point corresponding to a maximum 8-bit count $C_{MAX,8b}$ of counter 27 and a maximum output value $C_{MAX,10b}$ of converter 26. In this example, lower values of the count correspond to dark light levels while higher count values correspond to bright light levels. For higher count values, the 10-bit output is incremented by a larger step size than for lower count values. As a result, higher resolution is obtained for dark light levels. FIG. 4B shows an exemplary lookup table within converter 26 corresponding to the nonlinear function 47. The 8-b counter 27 has 256 possible binary outputs from 00000000 to 11111111 whereas converter 26 has a 10-b output code with 1,024 possible values from 0000000000 to 1111111111. By way of illustration, in accordance with the mapping function, as the 8-b count is incremented by one count for the lower count values, the 10-b output is decreased by one binary value, producing an exemplary step size of 0.5 mV for VREF. For the higher count values, the 10-b output is decreased by six binary values for each increment in the 8-b count, producing a 3 mV decrement for VREF with each clock pulse.

Figure 4D:
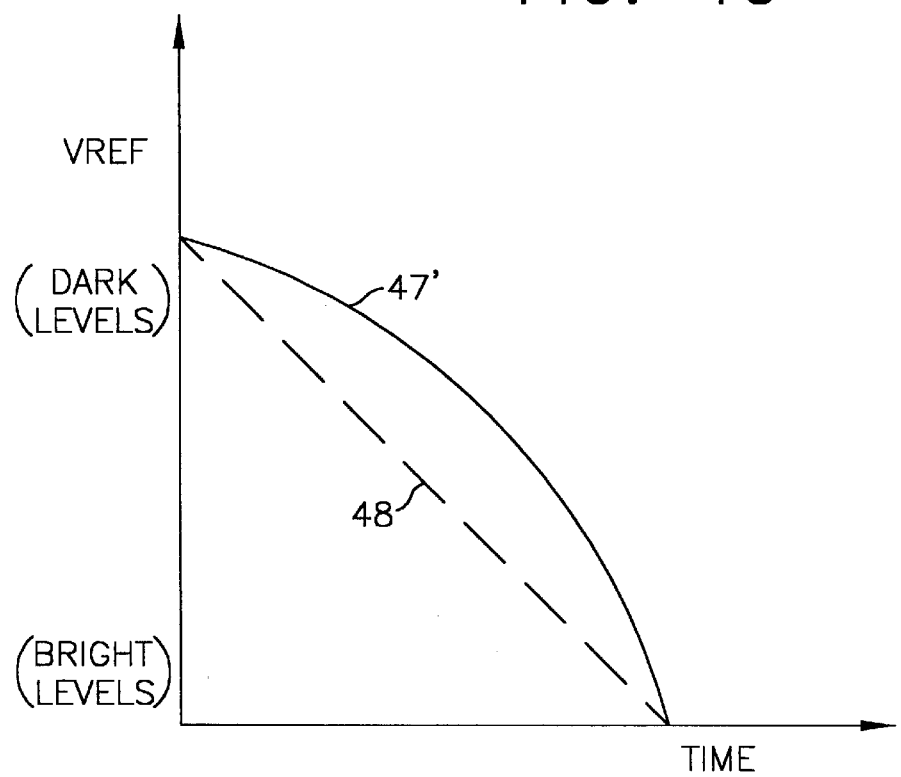
FIG. 4D is a graph illustrating an exemplary time varying reference voltage as a function of time.

The resulting variation of VREF as a function of time during each sampling window is shown in FIG. 4D, where curve 47' is essentially the inverse of curve 47 of FIG. 4A, and line 48 is a linear function drawn for comparison purposes. The magnitude of the slope of VREF vs. time becomes larger as the 8-bit count linearly increases during the sampling window.

Accordingly, for 8-b output data, there will be 256 possible outputs for 256 input counts, with higher resolution for pixel voltages corresponding to dark light levels than for bright light levels. The digitized outputs are applied to image storage and processing electronics which includes an inverse mapping function of the function 47, such that each 8-bit image datum can be mapped to the correct light intensity value when the image is reproduced. That is, each 8-bit image datum is decoded to the corresponding light intensity value upon image reproduction.

Figure 5:
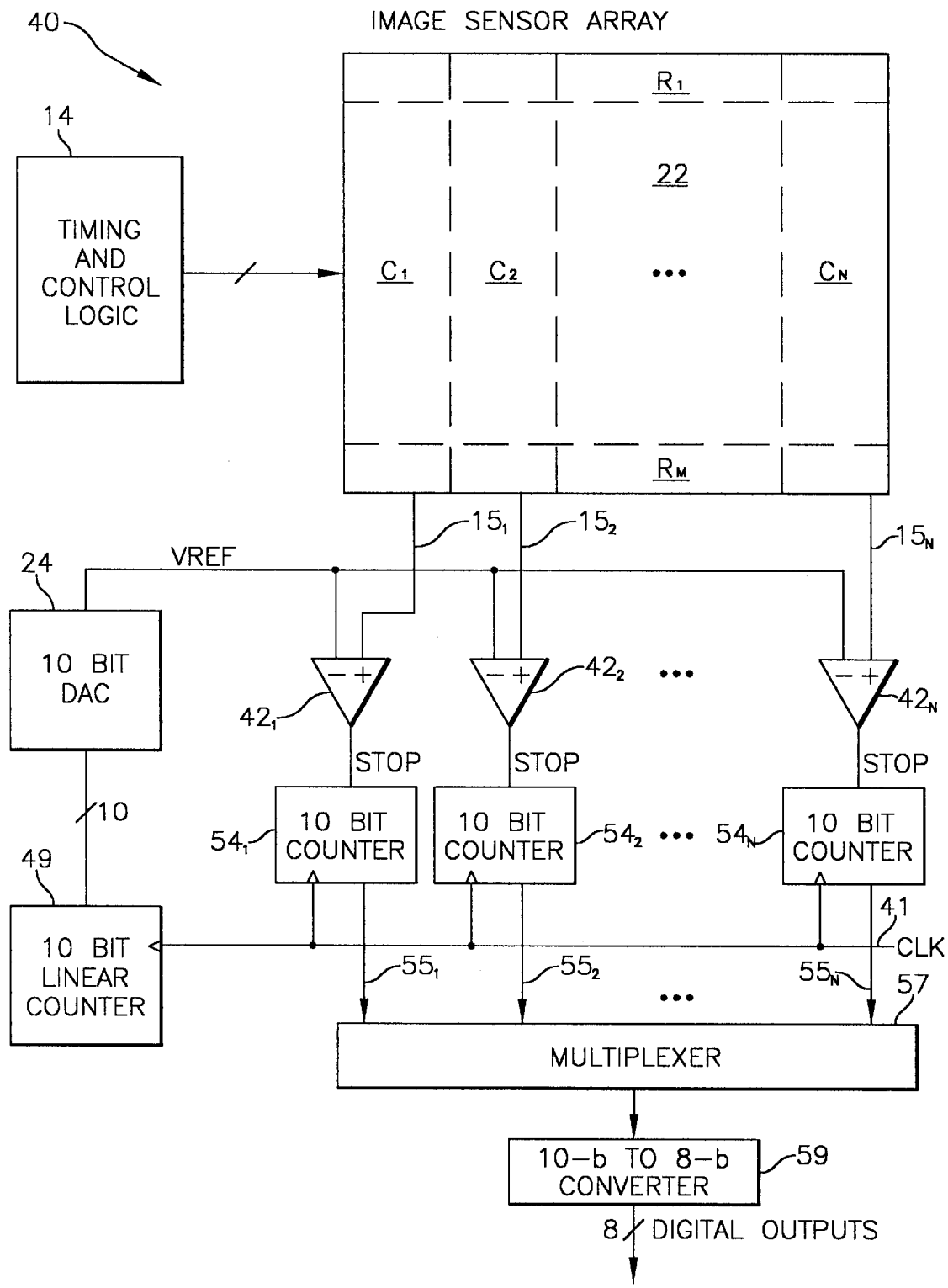
FIG. 5 is a schematic block diagram of an image sensor in accordance with a second embodiment of the present invention.

FIG. 5 illustrates another embodiment of the present invention, designated as image sensor 40. In this embodiment, the A/D conversion circuitry is comprised of comparators $42_1$-$42_N$, 10 bit counters $54_1$-$54_N$, a 10 bit linear counter 49, 10 bit D/A converter 24, a multiplexer 57 and a 10 bit to 8 bit converter 59. For each row sampling interval, the counters are first reset, then clock pulses on line 41 are applied to each of the 10 bit counters $54_1$-$54_N$ and 49. With each clock pulse, the count of each counter is incremented by one count. The output count of counter 49 is applied to D/A converter 24, which provides a linearly ramping output voltage VREF in correspondence with the input count, that ramps from a predetermined maximum voltage to a predetermined minimum voltage (or vice versa). For a negatively ramping VREF, as soon as the voltage on any given column data line $15_i$ is higher than VREF, the STOP signal output of comparator flips logic state, causing the current count to be latched within the associated counter $54_i$. When the count cycle for the active row is completed, the latched counts within counters $54_1$-$54_N$ are sequentially transferred, via multiplexer 57, to the 10-b to 8-b converter 59. Converter 59 maps each input code to a corresponding output code according to a nonlinear mapping function stored therein, e.g., in a look-up table in RAM or ROM, and sequentially transfers out digital outputs column by column.

Figures 6A, 6B:
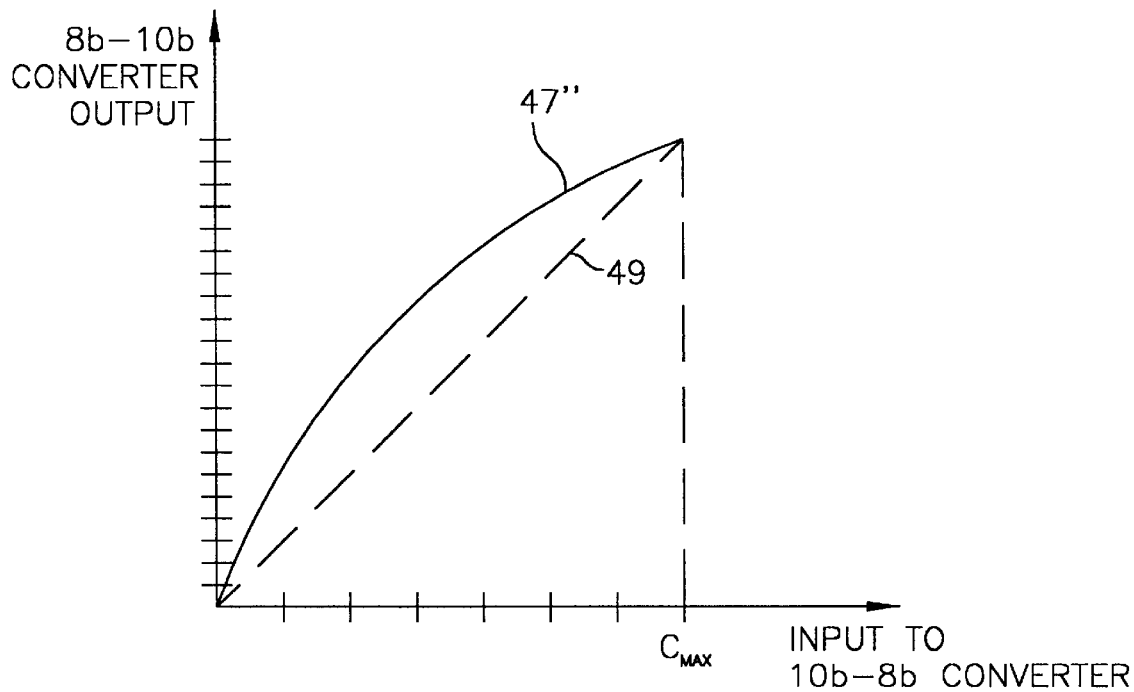
FIGS. 6A and 6B illustrate a transfer function of a high bit to low bit converter used in the image sensor of FIG. 5.

FIG. 6A illustrates a nonlinear mapping function 47" stored within 10b–8b converter 59. The input resolution for all image datums is the same; however, the output resolution for lower code values corresponding to dark light levels is greater than for that for higher code values corresponding to bright light levels. FIG. 6B shows an illustrative look-up table within converter 59 corresponding to the mapping function 47". In this example, for higher count values input to converter 59, the output resolution is degraded by assigning the same 8-bit output value for several 10-bit input codes (e.g., the same 8-bit code for six 10-bit codes). For lower code values, each 8-bit output corresponds to only one 10-bit input code. Thus, in this example, resolution for the darkest light levels is six times that for the brightest light levels.

Image sensor 20 of FIG. 3 is advantageous over image sensor 40 of FIG. 5, in that less clock cycles are necessary to ramp the reference voltage over a predetermined range for image sensor 20. For instance, if the maximum VREF voltage is set to correspond to an all zeroes count and the minimum VREF voltage is to correspond to an all ones count, then, for 8-bit output data in each case, image sensor 20 would require 256 clock pulses to complete a row sampling interval whereas image sensor 40 would require 1,024 clock pulses. Hence, for the sampling windows to occupy the same amount of time in the two cases, the clock pulses applied in image sensor 40 would need to be four times as fast as those applied for image sensor 20.

Figure 7:
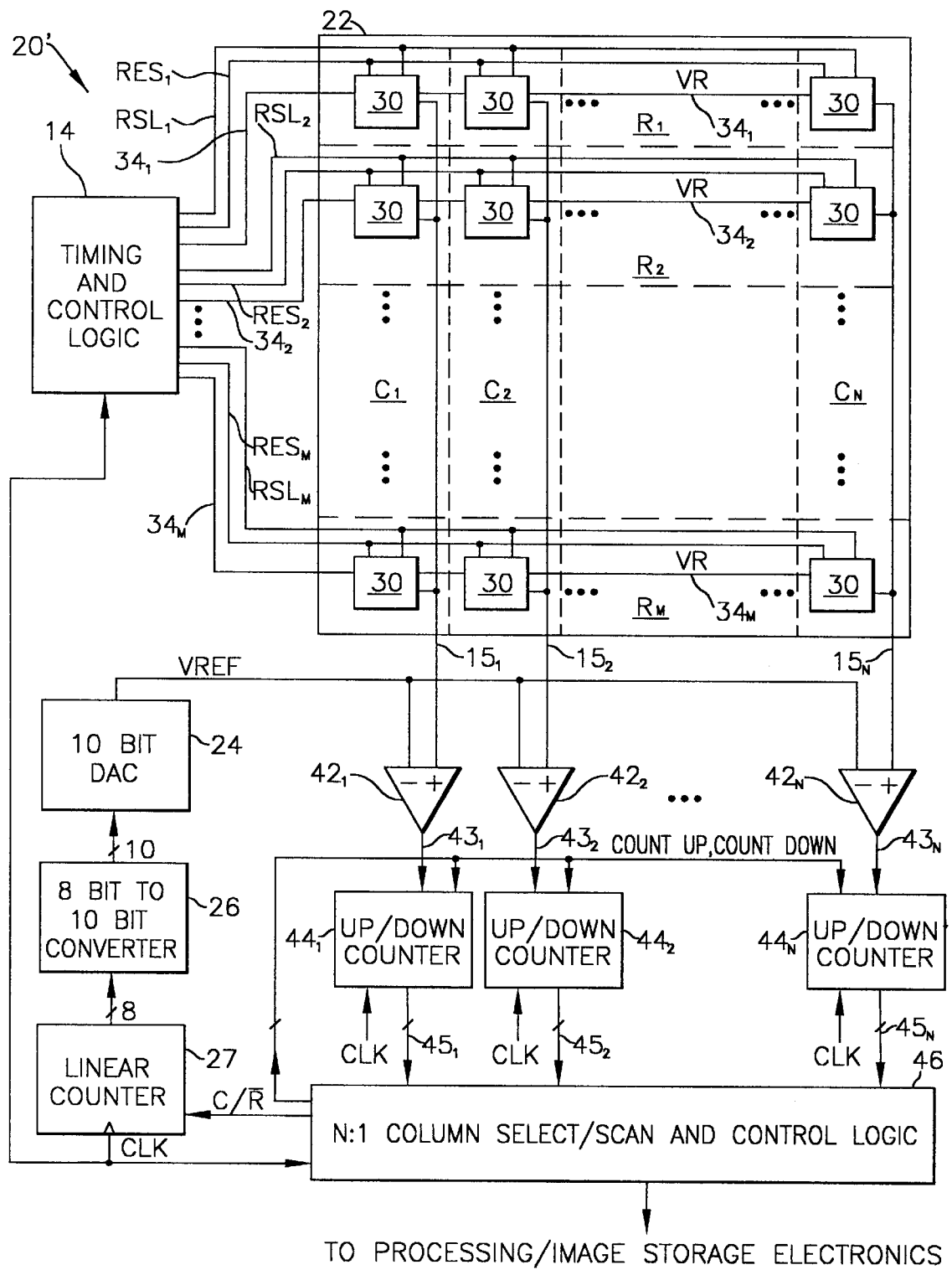
FIG. 7 is a schematic block diagram of a more specific embodiment of the present invention.

Referring now to FIG. 7, a more specific embodiment of the present invention, image sensor 20', is schematically illustrated. This embodiment represents a specific case of image sensor 20 discussed above, in which correlated double sampling is efficiently performed by embodying counters $44_1$-$44_N$ as up/down counters, similar to the approach taken in our above-noted co-pending patent application entitled CORRELATED DOUBLE SAMPLING WITH UP/DOWN COUNTER. Herein, image sensor 20' combines the up/down counting technique with the non-uniform mapping technique to achieve higher resolution for darker light levels, to provide a single correlated double sampled image datum output for each column.

In operation of image sensor 20', image data is read out row by row under the control of timing and control logic 14 and N:1 column select/scan and control logic 46. During each row sampling interval, n-bit linear counter 27 (e.g., 8-bit) counts up during a reset sampling window to generate a time varying reference signal VREF while n-bit up/down counters $44_1$-$44_N$ count down to sample the reset levels in each column. Following the reset sampling window, linear counter 27 is reset whereas the up/down counters each remain latched at the count corresponding to the measured reset level. In a second sampling window of the row sampling interval, the signal levels are sampled as counter 27 once again counts upwards while the up/down counters also count upwards. The final count in each up/down counter represents the signal level minus the reset level, i.e., the correlated double sampled image datum with the reset level and associated noise removed. By employing the 8-bit to 10-bit converter 26 and 10-bit DAC 24, VREF is caused to vary nonlearly during each sampling window, such that each output datum has higher resolution for dark light levels than for bright light levels. An inverse mapping function is utilized in subsequent processing to decode the 8-bit output data.

Figure 8:
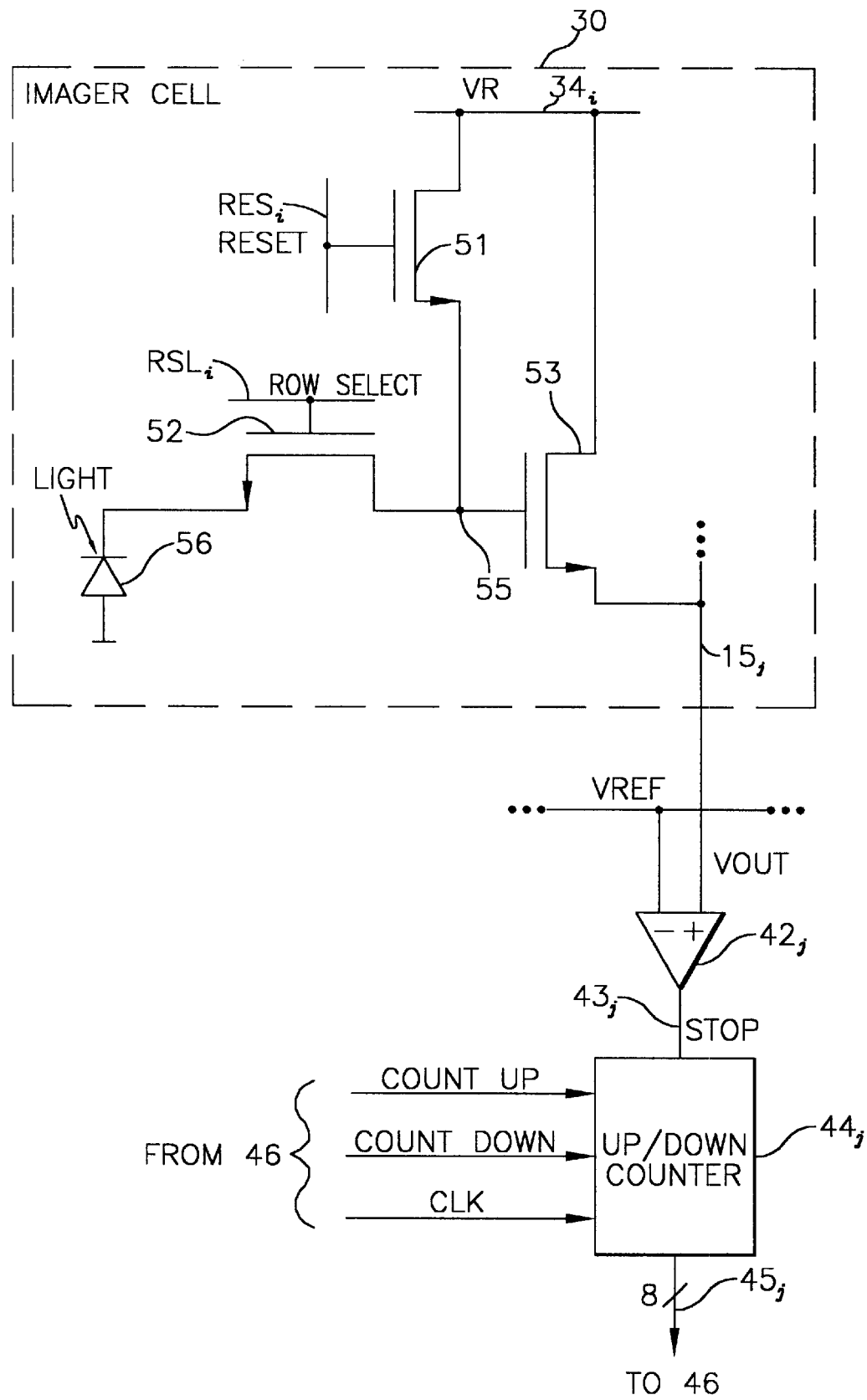
FIG. 8 illustrates an imager cell that may be used in the image sensor of FIG. 7.

More detailed operation of image sensor 20' is as follows. Timing and control logic 14 provides control voltages to imager cells 30 within rows $R_1$-$R_M$ of image sensor array 22 on lines $RES_1$-$RES_M$, $RSL_1$-$RSL_M$ and $34_1$-$34_M$. An exemplary imager cell (pixel) 30 in the "ith" row $R_i$ and "jth" column $C_j$ is schematically shown in FIG. 8. This imager cell is one of those disclosed in our commonly assigned, co-pending U.S. Pat. application Ser. No. 08/873,610, entitled IMAGE SENSOR PIXEL CIRCUIT, (hereafter, the "S. Gowda et al. I" application). Imager cell 30 is an improvement over the prior art cell of FIG. 1, in that the large row select MOSFET 12 is eliminated, thereby allowing more space for the photosensitive element, in this case, photodiode 56. In addition, less bus lines are required, which likewise creates more space for the photosensitive element. Only three bus lines—RESET line $RES_i$, VR line $34_i$ and ROW SELECT line $RSL_i$—are connected to the imager cells 30 of a common row $R_i$. Hence, with the imager cell 30 of FIG. 8, imager 20' can exhibit improved resolution over the prior art by utilizing the extra space created to provide a larger area for the photosensitive element and/or reduce the overall pixel size.

The pixel circuit of cell 30 eliminates the separate row selection transistor, since the row select line $RSL_i$ connects directly to the gate of FET 52. The pixel selection function is carried out in conjunction with reset transistor 51. As such, reset transistor 51 is functionally different from reset transistor 11 of FIG. 1, which, in the prior art, was used strictly for resetting the reference circuit node 17 (readout node). In the prior art, the bus line RES connecting the gate of FET 11 to timing and control logic 14 is typically tied to multiple rows, whereby the cells of multiple rows are reset together. In the embodiments disclosed herein, each reset bus RES is dedicated for a single row and is not tied to multiple rows, thereby enabling the reset device 51 to perform a partial pixel selection function as well as a reset function.

FET 51 operates to reset the reference circuit node 25 to nearly the voltage level VR on bus line $34_i$ when the RESET signal on the $RES_i$ bus is pulsed. Specifically, the node 55 voltage is reset to VR-$V_{DS51}$, where $V_{DS51}$ is about the same as the threshold voltage $V_{TH}$ of FET 51, typically about 0.4–0.5 volts. As will be explained more fully below, following the application of the RESET pulse, the voltage at reference node 55 is indicative of the reset level (including noise) during a first sampling time interval in which charge transfer device 52 is OFF. During a second sampling interval in which device 52 is ON, the reference node 55 voltage is indicative of photocharge collected by photodiode 56, and hence, the intensity of light incident upon cell 30. The gate of FET 52 is tied to the $RSL_i$ line to receive the ROW SELECT signal. In the prior art, the RSL line is tied to the separate MOSFET 12. With imager cell 30, the relatively small charge transfer FET 52 performs a partial pixel selection function formerly performed by the large MOSFET 12. Source follower FET 53 is used to buffer the voltage at reference node 55 and transfer an output voltage related to the photocharge to column data line $15_j$. At any given time, only one pixel 30 per column is active, as controlled by both the ROW SELECT signal and the RESET signal. As such, the voltage VOUT provided on column bus $15_j$ to the associated comparator $42_j$ is directly related to the voltage on reference node 55 of the active pixel.

In any event, image sensor 20' of FIG. 7 may alternatively utilize other pixel circuit configurations for the imager cells 30 used in conjunction with the non-uniform A/D conversion. The present invention is not limited to an image sensor using the imager cell of FIG. 8. In essence, any pixel circuit which allows the separate sampling of the reset and signal samples can be used within image sensor 20'. For example, any of the other pixel circuit configurations disclosed in the S. Gowda et al. I patent application cited above, may be used. That patent discloses various modifications to the pixel circuit of FIG. 8 herein, such as: employing a phototransistor in place of photodiode 56; including an anti-blooming transistor within each cell; and including a shutter transistor within each cell to perform electronic shuttering. The Mendis et al. pixel circuit shown in FIG. 1 herein can also be used, although this configuration is not preferred as discussed above.

Figure 9:
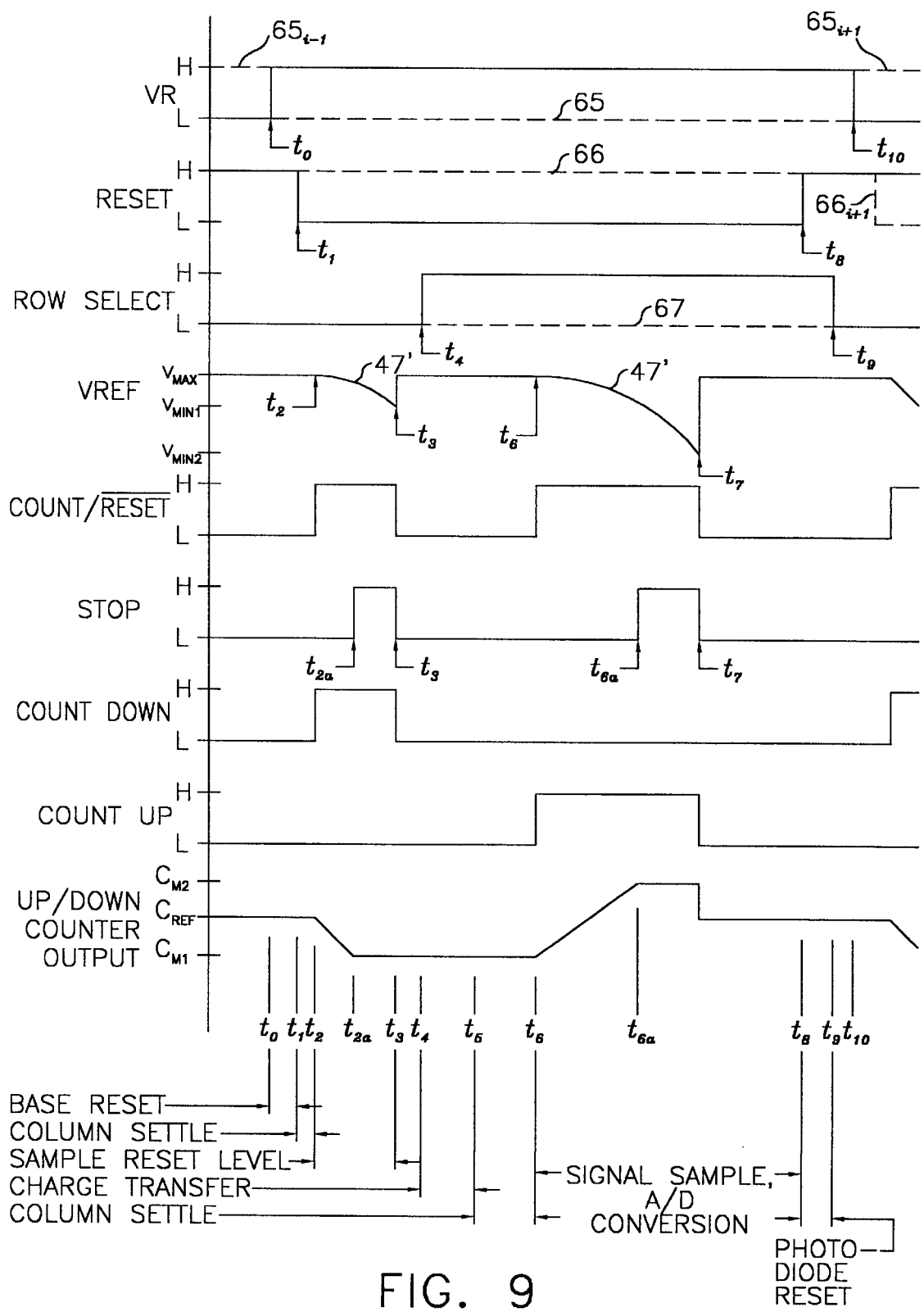
FIG. 9 is a timing diagram of voltage waveforms applied to image sensor cells and to correlated double sampling circuitry within the image sensor of FIG. 7.

Operation of image sensor 20' of FIG. 7 (with imager cells 30 of FIG. 8) will now be described in conjunction with the timing diagram of FIG. 9. The solid lines of the VR, RESET and ROW SELECT waveforms in the diagram represent the waveforms applied to the active pixel 30 of column $C_j$. The dotted lines 65–67 represent the respective waveforms applied to inactive pixels 30 in that column (i.e., inactive during the time interval from time $t_0$ to $t_9$). The ensuing discussion pertains to the active pixel. The time prior to time $t_0$ represents a photocharge collection period for all the pixels in a row (e.g., for the "ith" row, $R_i$). In this period, VR is low, RESET is high, and ROW SELECT is low. "High" potential for the various waveforms discussed herein is typically 1.2, 1.8, 2.5, 3.3 or 5 volts; "low" is typically zero volts. Photocharge is collected in the photodiode during the photocharge collection period and the potential of photodiode 56, relative to the substrate that it is fabricated in, is lowered corresponding to the amount of photocharge collected. Since ROW SELECT is low, FET 52 is OFF and the photocharge does not get transferred out during this time. Also, RESET is high, turning FET 51 ON, whereby reference node 55 is set at a potential close to VR, which is low. As such, the gate of FET 53 is low, turning FET 53 OFF, such that no voltage from that pixel is put on column bus $15_j$. Meanwhile, VR is high for the pixels 30 in the preceding row $R_{i-1}$ as indicated by waveform portion $65_{i-1}$, to permit data readout from the pixels in that row.

At time $t_0$, VR applied to the pixels 30 of row $R_i$ is raised, whereupon a "base reset/read" period commences to set a base reference level at reference node 55 and read out the same. When VR is high, reference node 55 is set to a high potential since FET 21 is still ON. The RESET signal is then brought low at time $t_1$, e.g., five microseconds after time $t_0$, isolating reference node 55 from the VR bus $34_i$. Due to parasitic gate to source capacitance of the reset FET 51, noise on the RES (clock) line feeds through to reference node 55. As such, this "clock feedthrough" due to RESET going low is also stored in circuit node 55. When RESET is brought low at time $t_1$, the potential of node 55 remains close to its previous value when RESET was high due to the capacitance between reference node 55 and the substrate potential. The node 55 potential is then sampled through source follower FET 53, which provides the voltage VOUT on column bus $15_j$ at a value directly related to the reference node 55 voltage, by virtue of the gate to source voltage drop of source follower FET 53.

After an appropriate "column settle" time between times $t_1$–$t_2$, the voltage VOUT, which corresponds to the reset level at this time, is sampled as follows: at time $t_2$, a COUNT/RESET (C/R) signal generated by logic block 46 and applied to liner counter 27, is raised to a logic high. When high, this signal commands counter 27 to begin counting. Prior to time $t_2$, the count of counter 27 was previously reset to zero following image data readout from the preceding row $R_{i-1}$. The output count of counter 27 is applied to 8-bit to 10-bit converter 26, which has the nonlinear mapping function 47 as was described above in reference to FIGS. 4A and 4B.

The nonlinearly mapped, 10 bit output code of converter 26 is converted to the time varying reference signal VREF by 10 bit DAC 24. As counter 27 counts upward during time interval $t_2$–$t_3$, VREF ramps nonlinearly downward in a staircase as shown by curve 47', which is the same curve as was shown in FIG. 4D and described earlier. VREF ramps nonlinearly from $V_{MAX}$ at time $t_2$ to a first minimum level $V_{MIN1}$ at time $t_3$. The C/R signal is brought low at time $t_3$ which resets the count to zero and VREF back at $V_{MAX}$. The voltage range of $V_{MIN1}$ to $V_{MAX}$ is established based on the expected extremes of the voltage range at reference node 55 within the pixels 30 during the reset period. This range is preferably determined based on experimental observation of the reference node voltage for typical pixels.

During the time interval from $t_2$–$t_3$, a COUNT DOWN pulse from logic block 46 is applied to each one of the up/down counters $44_1$-$44_N$ to cause each counter to count down, beginning at time $t_2$, from a predetermined reference count $C_{REF}$ which is preferably all zeroes, e.g., 00000000 for an 8-bit counter. The count of each up/down counter is decreased in synchronism with the count of up counter 27 being increased. (The first down count from an all zeroes count is an all ones count). As each up/down counter as $44_j$ counts down, it receives a logic level output, designated STOP from the associated comparator $42_j$ on line $43_j$ (see FIG. 4). The STOP signal is in a first state, e.g., low, when VREF exceeds VOUT. When a low STOP level is received by up/down counter $44_j$, the downward counting proceeds uninhibited. As VREF ramps downward, as soon it falls below VOUT, the STOP level output by comparator $42_j$ flips to the opposite (high) state. Up/down counter $44_j$ responds to this changed state by ceasing to count, whereby the count is latched at a value substantially corresponding to the reset level VOUT for the active pixel 30. In FIG. 5, STOP is shown rising high at time $t_{2a}$, latching the up/down counter output count at a first measured count $C_{M1}$.

It is noted that sampling is avoided during the column settle interval ($t_1$ to $t_2$) to avoid sampling transient noise associated with the reset FET 21 being rapidly turned off. The column settle interval $t_1$–$t_2$ may be, e.g., one microsecond.

During the readout interval for row $R_i$, i.e, between times $t_0$–$t_9$, it is important that no voltage be put on the column bus by the pixels in the other rows, which would otherwise diminish accuracy of the reset and signal data readout from the active pixels. As such, the VR, RESET and ROW SELECT signals applied to the inactive pixels are low, high and low, respectively, as indicated by respective waveform portions 65, 66 and 67. The source follower FET 53 of the inactive pixels will then be off during this time. As such, the output voltage provided on each column bus as $15_j$ corresponds only to the reference node 55 voltage of the active pixel 30 in that column.

A charge transfer interval for the active pixels commences at time $t_4$ by raising the ROW SELECT signal applied to row $R_i$. This turns on the charge transfer FET 52 of the pixels 30 in row $R_i$, thereby allowing the charge collected in photodiode 56 to be transferred from the photodiode capacitance to the capacitance at reference node 55. (In some photodiode designs, the charge may be shared among the photodiode capacitance and the reference node capacitance). The potential of reference node 55 will fall corresponding to the amount of electrons collected in photodiode 56, which, in turn, is proportional to the intensity of light that was incident upon the photodiode. VOUT will fall corresponding to the reference node 55 potential. Thus, if a dark condition exists, VOUT will be close to the reset level. If a high intensity light (bright light) is incident upon the active pixel, VOUT will fall towards a minimum level.

The charge transfer interval $t_4$–$t_5$ is typically on the order of two microseconds. After a second column settle interval between times $t_5$–$t_6$, the COUNT/RESET signal is brought high again at time $t_6$, causing up counter 50 to start counting again starting from the minimum count of zero. Hence, VREF ramps down again in a nonlinear fashion according to curve 47' from $V_{MAX}$ at time $t_6$ to a predetermined value $V_{MIN2}$ at time $t_7$. The brighter the light incident upon the active pixel, the lower the value of VOUT on the column data line. Dark light levels correspond to higher voltages. As such, curve 47' is designed with a lower slope corresponding to the higher voltage levels to obtain higher resolution for the dark light. $V_{MIN2}$ is established as a voltage below the minimum that would be expected for any of the active pixels 30 in the signal read period, preferably based on experimental observation.

At time $t_6$, a COUNT UP signal, generated by logic block 46 and applied to each of up/down counters $44_1$-$44_N$, is brought high, thereby causing each up/down counter to start counting upward from its previous count $C_{M1}$ corresponding to the reset level just measured. The upward count of up/down counter $44_j$ continues as long as the STOP signal output by comparator $42_j$ is low, which will be the case when VREF exceeds VOUT. As soon as VREF falls below VOUT, STOP flips high, causing up/down counter $44_j$ to stop counting and to latch at its current count, e.g., $C_{M2}$. The difference in the count of up/down counter $44_j$ between the count at times $t_6$ and $t_{6a}$, i.e., $C_{M2}$–$C_{M1}$, corresponds to the voltage level of the signal sample (second sample). Thus, when the count stops, the absolute count of $C_{M2}$ is latched and corresponds to the signal level for the active pixel minus the reset level just measured. This completes the correlated double sampling operation, whereby errors due to transistor mismatches, offsets and noise are substantially eliminated in the final image data.

The 8-bit output count of each up/down counter $44_1$-$44_N$ is then transferred to logic block 46 after time $t_7$ and before the readout interval for the pixels of the next row $R_{i+1}$. The transfer to logic block 46 preferably occurs simultaneously for all columns, in either a bit serial or a bit parallel fashion. When the output count for any up/down counter is transferred out, the count for that up/down counter is reset to the all zeroes count. In the example of FIG. 9, the output count transfer for each up/down counter occurs approximately at time $t_7$. Logic block 46 outputs the final image data corresponding to each pixel 30 in the array to image storage and processing electronics.

After the signal read time interval (designated as the time interval from t6–t8 photodiode 26 needs to be reset to a high potential before the next cycle of photocharge collection can begin. This is accomplished by raising the RESET signal at time $t_8$ high, while keeping the ROW SELECT and VR bus signals high. As such, reference node 55 will be high, and the photodiode is reset to a high potential since FET 52 is ON. Following this operation, ROW SELECT is brought low again at time $t_9$ to turn FET 52 OFF and isolate reference node 55 from photodiode 56, which begins another cycle of photocharge collection. RESET remains high and VR goes low at time $t_{10}$, thus inactivating source follower FET 53 and allowing FET 53 of other pixel rows to put signals on column bus $15_j$. This is illustrated by waveform portions $65_{i+1}$ and $66_{i+1}$ representing the respective waveforms applied to the next row $R_{i+1}$.

If a pinned photodiode is used for the photosensitive element, the photocharge collected in the pinned photodiode can be completely transferred to reference node 55 without charge sharing. In the pinned photodiode case, the photodiode reset period is not necessary because the signal read results in complete charge transfer and the photodiode is reset as it is read.

For applications in which slow image data readout from the pixels is acceptable, it is possible to utilize a lower number of up/down counters 44 and/or a lower number of comparators 42 than the number of columns. In this case, time multiplexing of the data on the column data lines would be necessary via appropriate switches added to the circuit. In an extreme case, it is possible to use a single comparator with a single up/down counter.

The up/down counting technique to automatically perform correlated double sampling can also be implemented with the image sensor 40 of FIG. 5 by using up/down counters for the 10-bit counters $54_1$-$54_N$. In this case, with appropriate timing and control signals similar to those just described for sensor 20', the 10-bit output data would represent correlated double sampled data, which would then be converted to 8-bit data by converter 59.

As an alternative to using up/down counters to automatically perform correlated double sampling for the image sensors of FIGS. 3 and 5, the reset samples and signal samples could be separately transferred out via appropriate registers, and the CDS subtraction subsequently performed by suitable processing circuitry. In this case, each 8-bit output datum may be decoded by the processing circuitry to its corresponding voltage prior to the subtraction of the measured reset level from the signal level.

Figure 10:
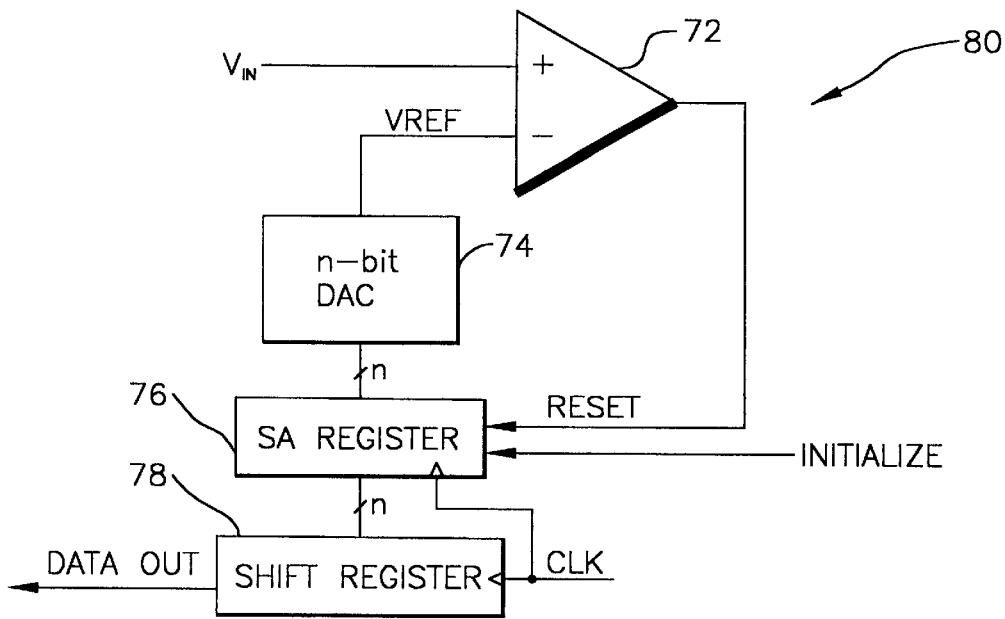
FIG. 10 is a block diagram of a prior art successive approximation A/D converter.
Figure 11:
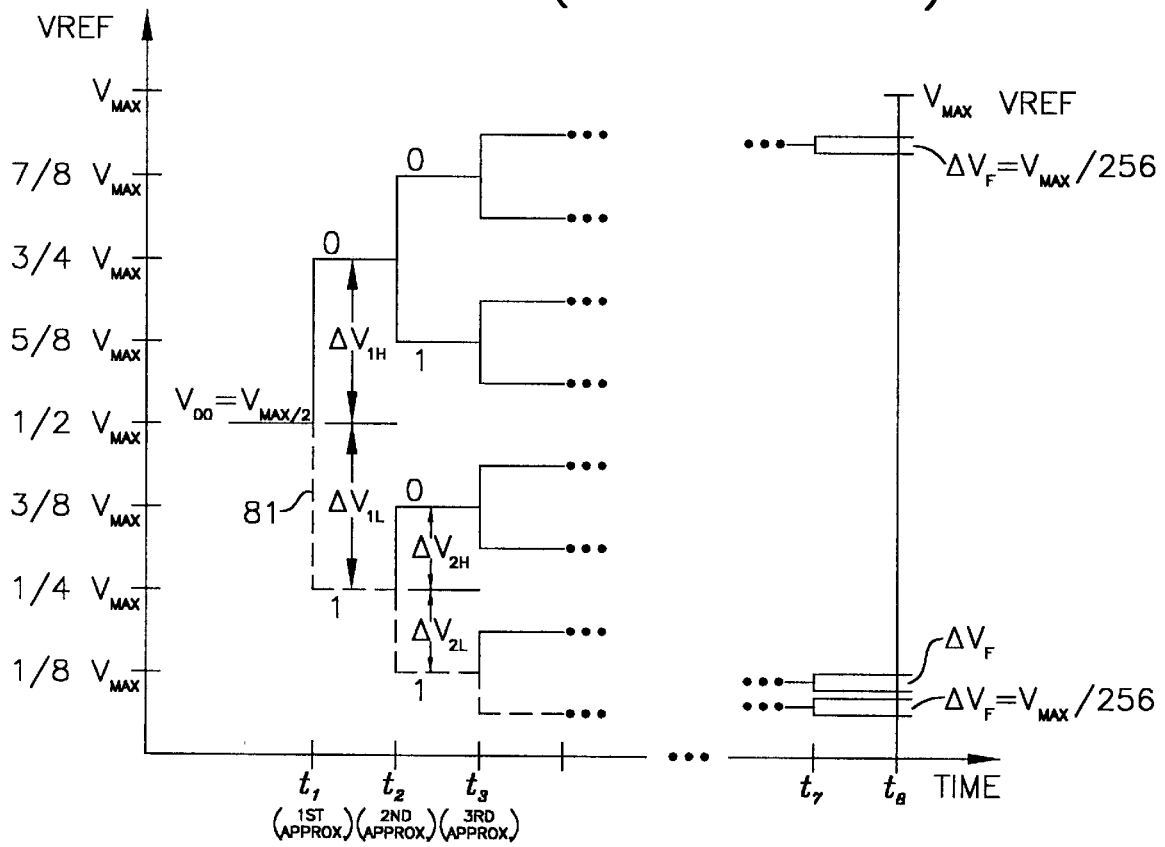
FIG. 11 illustrates reference voltage variation in the converter of FIG. 10.

Yet another embodiment of the present invention is directed towards a non-uniform successive approximation analog to digital converter (ADC) for imaging applications. To provide a foundation for the understanding of this embodiment, reference is first made to FIG. 10, which is a block diagram of a prior art successive approximation ADC 80. A comparator 72 determines if an analog input signal $V_{IN}$ is larger than a reference voltage $V_{REF}$ and provides a logic level output "RESET" which is high if $V_{IN}$ is larger than $V_{REF}$ and low if $V_{REF}$ is larger. To arrive at an approximation for $V_{IN}$, the reference voltage $V_{REF}$ is caused to vary in successive steps over a predetermined range, e.g., zero volts (corresponding to an all ones count) to $V_{MAX}$ volts (corresponding to an all zeroes count) as shown in FIG. 11. $V_{REF}$ is initially set at a voltage $V_{00}$ of approximately $V_{MAX}/2$ by means of an INITIALIZE control signal applied to a successive approximation (SA) register 76, which responds by initially providing an output code corresponding to $V_{MAX}/2$, e.g., 10000000 for an eight bit register. An n-bit digital to analog converter (DAC) 74 converts this output code to the corresponding voltage $V_{REF}$. (In this example, DAC 74 has the inverse D/A transfer characteristic as shown in FIG. 4C). At time $t_1$ corresponding to a first approximation and to a first clock pulse input, SA register 76 determines, based on the RESET signal at the comparator 72 output, whether $V_{IN}$ exceeds the current value of $V_{REF}$. If $V_{IN}$ is greater, SA register 76 sets the most significant bit (MSB) of its output code to zero, resulting in an increase in $V_{REF}$ by $\Delta V_{1H}$ to $(3/4)V_{MAX}$. Thus, the output code would be 01000000 in this case. On the other hand, if $V_{IN}$ is less than $V_{REF}$ (i.e.,<$V_{MAX}/2$ in this example) then the MSB changes to one, changing the output code to 11000000 and thus decreasing $V_{REF}$ by $\Delta V_{1L}$ to $(1/4)V_{MAX}$. In both of the above cases, the decision changed the most significant bit; however, the second most significant bit changed from 0 to 1 in each case to thereby set $V_{REF}$ in the middle of the next approximation window. Also, $\Delta V_{1H}$=$\Delta V_{1L}$, whereby the next approximation windows are uniform.

At time $t_2$, the second approximation is made by SA register 76 setting the next significant bit (2nd MSB) in accordance with the logic value of the RESET signal. If, for example, the first decision changed $V_{REF}$ to $(1/4)V_{MAX}$, as indicated by dotted line 81 in FIG. 11, then if $V_{IN}$ exceeds ($\frac{1}{4}$)$V_{MAX}$, the 2nd MSB is zero, and the output code changes to 10100000 corresponding to $V_{REF}$=($\frac{3}{8}$)$V_{MAX}$. $V_{REF}$ is thus incremented by $\Delta V_{2H}$. Otherwise, the 2nd MSB is zero and the code changes to 11100000 corresponding to ($\frac{1}{8}$)$V_{MAX}$, so that VREF decreases by $\Delta V_{2L}$. Again, the next significant bit (in this case, the 3rd most significant bit) was changed to 1 in order for $V_{REF}$ to be placed in the middle of the next approximation range. Also, the increment step $\Delta V_{2H}$ equals the decrement step $\Delta V_{2L}$, and the current step size is half the previous step size. As a result, the conventional ADC provides uniform A/D conversion. As the reference voltage change becomes finer each time, the output of the DAC approaches the input signal $V_{IN}$ in higher resolution after each step.

The successive approximation process is repeated until the lowest significant bit (LSB) is resolved, i.e., after n approximations for n-bit output data. For instance, if n=8, the resolution of the approximation will be $\Delta V_F$=$V_{MAX}$/256, for all values in the predetermined voltage range. When the final approximation is made, the last code in SA register 76 is transferred to shift register 78 which shifts out the output datum corresponding to the current input voltage $V_{IN}$ to complete the digitization.

If the above-described succession approximation ADC 80 with uniform A/D conversion is used in conjunction with an image sensor array, the resolution for the bright light levels would be the same as that for the dark light levels.

Figure 12:
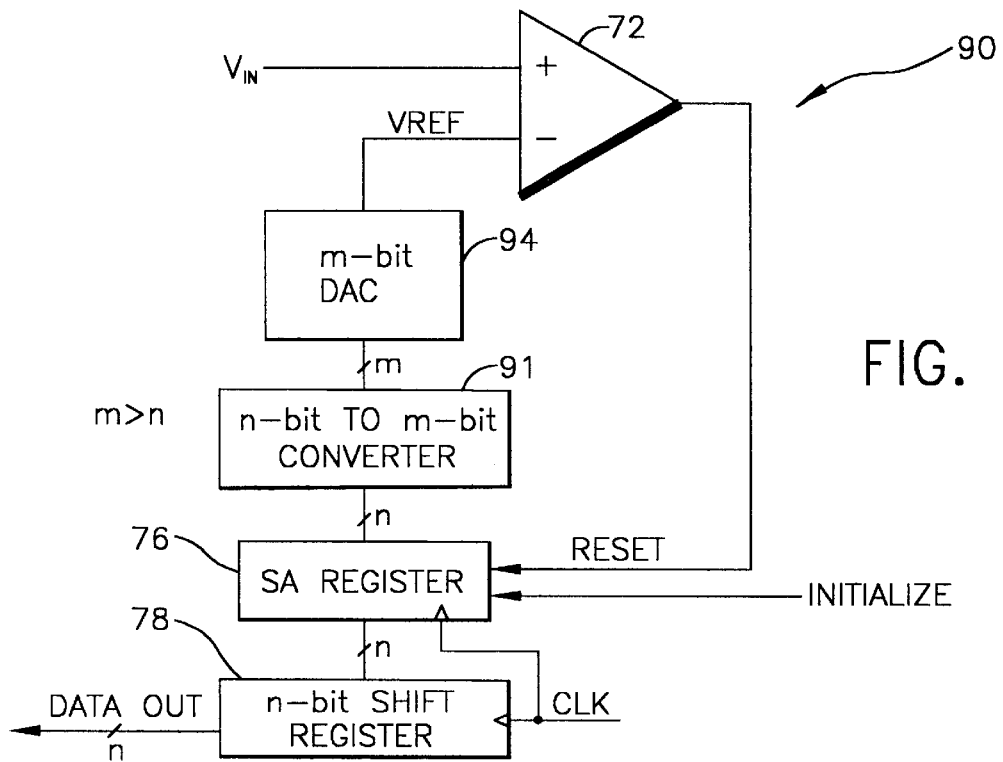
FIG. 12 is a block diagram of a non-uniform successive approximation A/D converter in accordance with the present invention.

In accordance with an embodiment of the present invention as shown in FIG. 12, a non-uniform successive approximation A/D technique is provided which, when employed in conjunction with an image sensor array, affords higher resolution for darker light levels than for bright light levels. As a result, improved resolution is obtained for a given number of bits.

Referring to FIG. 12, successive approximation ADC 90 includes comparator 72 which compares reference voltage $V_{REF}$ with the input voltage $V_{IN}$ and provides a logic signal RESET to SA register 76 as was described above. In this embodiment, $V_{REF}$ is caused to vary in a non-uniform manner to digitize input voltages corresponding to dark light levels with higher resolution than for input voltages corresponding to bright light levels. As such, more bits are allocated for the voltage levels corresponding to darker light.

Figure 13A:
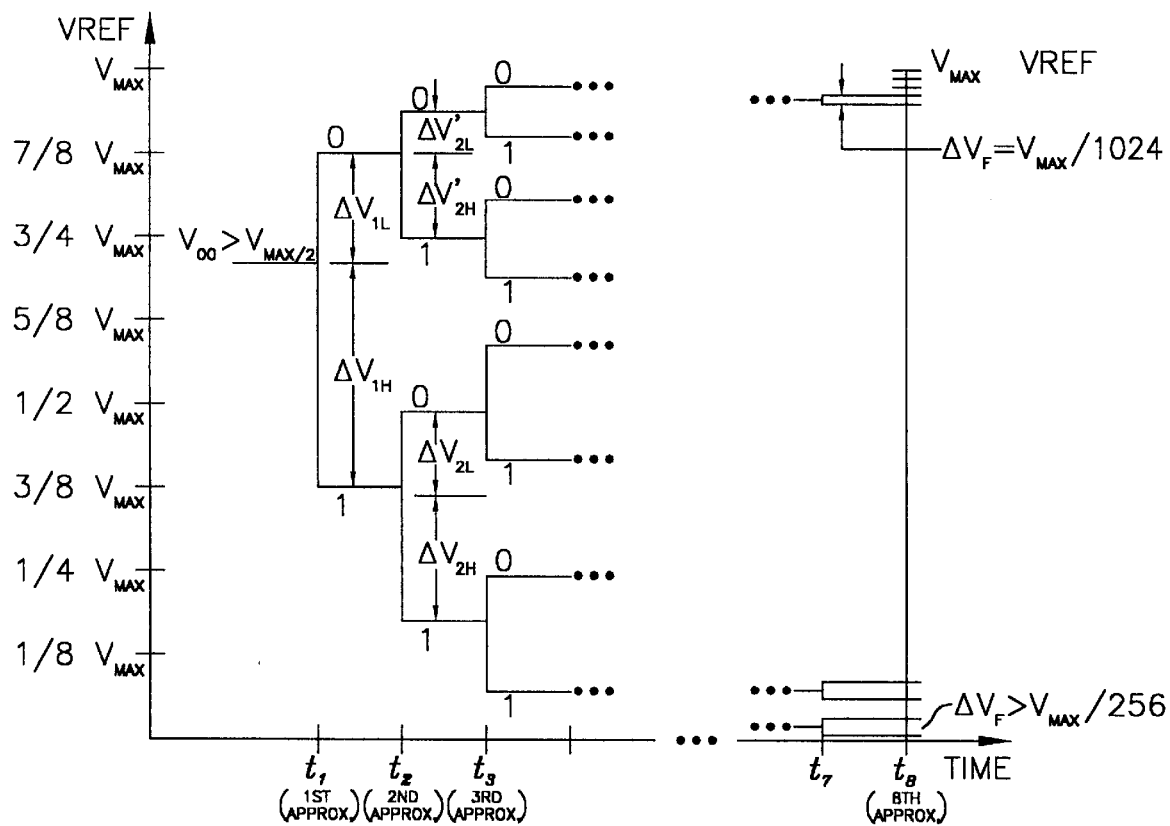
FIG. 13A illustrates reference voltage variation in the converter of FIG. 12.

With reference to FIG. 13A in conjunction with FIG. 12, $V_{REF}$ is initially set at a voltage $V_{00}$ of greater than $V_{MAX}$/2, where the predetermined range of $V_{REF}$ variation is from zero volts to $V_{MAX}$ volts. To initially set $V_{REF}$, an INTIALIZE control pulse is applied to n-bit SA register 76, setting its output at a code corresponding to one half the maximum possible output, e.g., at 10000000 for n=8. This code is supplied to n-bit to m-bit converter 91, where m>n. Bit converter 91 includes a storage device such as RAM or ROM having a look-up table that nonlinearly maps n-bit input codes to m-bit outputs, similar to that described above in reference to FIGS. 4A and 4B.

The initial n-bit input code of 10000000 is converted by bit converter 91 to an initial m-bit output (e.g., 10-bit) corresponding to a $V_{REF}$ value greater than $V_{MAX}$/2. M-bit DAC 94, which has the D/A transfer characteristic as shown in FIG. 4C, converts this initial code to the voltage $V_{REF}$ which is compared to $V_{IN}$ by comparator 72. At time $t_1$ (first approximation), the RESET output of comparator 72 indicative of the comparison is applied to SA register 76 which then sets the most significant bit of its output code to a zero if RESET is high and to a one if RESET is low. Bit converter 91 then converts the modified n-bit output of SA register 76 to a corresponding m-bit code stored in the look-up table therein. If the MSB of the n-bit code is zero, $V_{REF}$ is caused to increase by $\Delta V_{1L}$; if the MSB is one, $V_{REF}$ decreases by $\Delta V_{1H}$, where $\Delta V_{1H}$ is greater than $\Delta V_{1L}$.

Figure 13B:
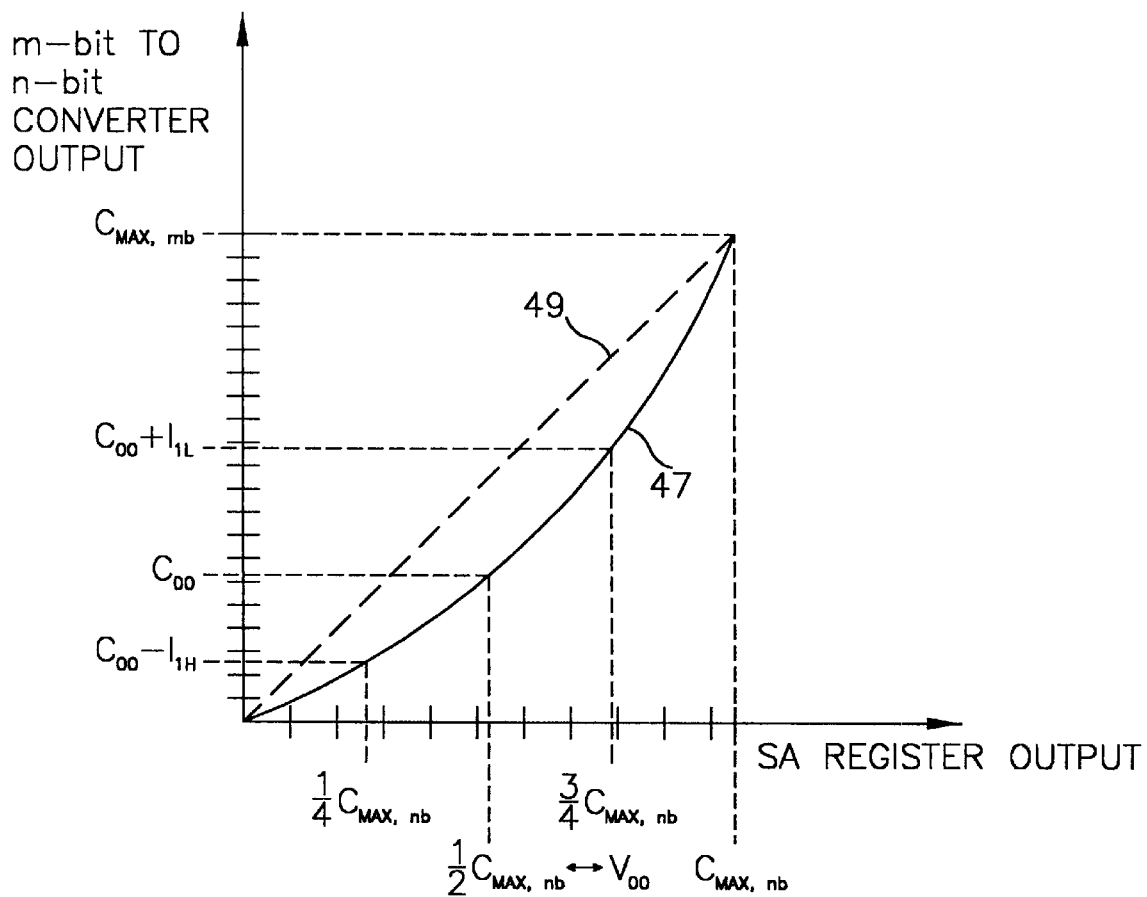
FIG. 13B illustrates a transfer characteristic for an exemplary code converter in the ADC of FIG. 12.

FIG. 13B illustrates the nonlinear mapping of the n-bit input to the m-bit output within bit converter 91. Assuming that the maximum number of output codes of n-bit SA register 76 is $C_{MAX,nb}$, the initial output of register 76 is set to $C_{MAX,nb}$/2, corresponding to $V_{REF}$=$V_{00}$=$V_{MAX}$/2. The corresponding output code of bit converter 91 is $C_{00}$, as shown in the figure, which is less than one half the maximum output code value of bit converter 91, $C_{MAX,mb}$. With the first comparison at time $t_1$, the MSB of the SA register 76 changes, such that the register 76 output changes to either ($\frac{1}{4}$)$C_{MAX,nb}$, or ($\frac{3}{4}$)$C_{MAX,nb}$, depending on the level of the RESET signal. The bit converter 91 output code then changes either to $C_{00}$+$I_{1L}$ or to $C_{00}$−$I_{1H}$, where $I_{1L}$ is greater than $I_{1H}$. Since the analog output of DAC 94 is inverted with respect to the bit converter 91 output, $V_{REF}$ is thus produced as shown in FIG. 13A.

Comparator 72 then compares the new value of $V_{REF}$ with $V_{IN}$, and outputs RESET as a zero if $V_{IN}$>$V_{REF}$ and as a one if $V_{REF}$>$V_{IN}$. SA register 76 then sets its second most significant bit to one at time $t_2$ if RESET is low and to zero if RESET is high. Converter 91 immediately modifies its output code by mapping the new n-bit input code to the corresponding m-bit code in the look-up table. If the MSB of the n-bit code was 0 and the second most significant bit of the n-bit code is 0, $V_{REF}$ is caused to increase by $\Delta V_{2L}$'; if the MSB is 0 and the second MSB is 1, $V_{REF}$ decreases by $\Delta V_{2H}$, which is larger than $\Delta V_{2L}$'. If the MSB was 1 and the second MSB is 1, $V_{REF}$ decreases by $\Delta V_{2H}$; if MSB was 1 and the second MSB is 0, $V_{REF}$ increases by $\Delta V_{2L}$, which is a smaller increment than $\Delta V_{2H}$. Comparator 72 again compares the new $V_{REF}$ with $V_{IN}$, and the process continues with finer and finer increments until the LSB is resolved. By the last approximation, e.g., the eighth approximation for 8-bit output data, assuming m=10, the final increment $\Delta V_F$ of $V_{REF}$ is approximately $V_{MAX}$/1,024 for the smallest values of $V_{IN}$ corresponding to the darkest light levels, and is greater than $V_{MAX}$/256 for the larger values of $V_{REF}$ corresponding to the brightest light levels. As such, 10-bit resolution is provided for the dark levels and less than 8-bit resolution is provided for the bright levels.

When the least significant bit is resolved, the last n-bit code stored in SA register 76 is transferred out as an output datum via n-bit shift register 78. In subsequent processing of the output data, an inverse look-up table, or inverse mathematical function corresponding to the nonlinear function within the converter 91, will be necessary to decode the 8-bit data to the proper voltage.

Accordingly, two advantages are apparent for the approach of FIGS. 12 and 13 over that of FIGS. 11 and 12. First, higher resolution is obtained for a desired portion of the input signal range while less resolution is realized for other parts of the range, while employing the same number of output bits. Higher resolution is thus obtainable with the same overall number of bits, so the storage requirements remain the same. In addition, the time required to complete the successive approximation is about the same as for the conventional case, since the number of approximations for each sample corresponds to the lower integer n rather than the higher resolution number m.

Figure 14:
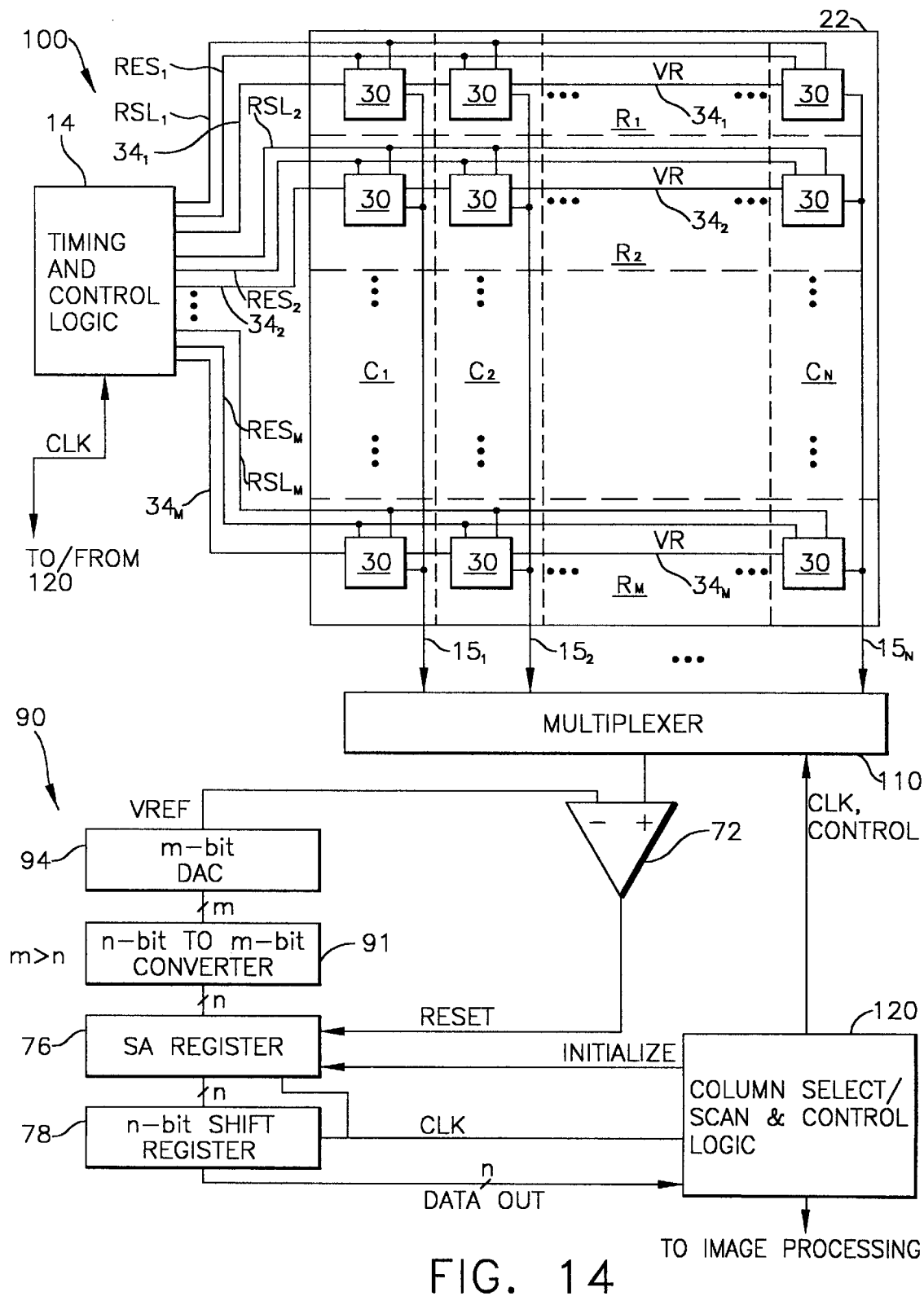
FIG. 14 is a schematic block diagram of an image sensing device in accordance with the present invention employing a non-uniform successive approximation A/D converter.

With reference now to FIG. 14, the non-uniform successive approximation ADC 90 is shown integrated into an image sensing device 100. In this embodiment, column data lines $15_1$-$15_N$ of image sensor array 22 are connected to the inputs of a multiplexer 110 which receives clock and control signals from column select/scan and control logic 120. Image data is read out and digitized row by row under the control of timing and control logic 14 and logic block 120. For each row sampling interval, the data on the column data lines are digitized one column at a time by ADC 90 under the control of control logic 120. The multiplexed outputs of multiplexer 110 are applied to the non-inverting terminal of comparator 72. ADC 90 operates in the manner described above to arrive at an approximation for the analog input signal to comparator 72. Each digital output datum is applied to logic block 120, which sequentially shifts the data out to image processing electronics. The image processing electronics includes an inverse mapping function to that stored within n-bit to m-bit converter 91, to decode the n-bit output data to the proper light intensity levels. Correlated double sampling is preferably employed to obtain a reset sample and a signal sample for each pixel during each row sampling interval. The reset samples are subtracted from the corresponding signal samples by image processing electronics to complete the CDS operation.

While the above description contains many specifics, these specifics should not be construed as limitations on the scope of the invention, but merely as exemplifications of preferred embodiments thereof. For example, the A/D conversion circuitry of this invention may be used in applications other than those involving image sensors, such as with temperature/pressure sensors. The A/D conversion circuitry disclosed herein can be used in any application where it is desired to obtain higher resolution over one portion of a target signal range than other portions of the range. In addition, the invention can be used in conjunction with an image sensor comprising only a single row of pixels. Further, while the comparators throughout the description have been described as voltage comparators, it is understood that comparison circuitry comparing current levels can be utilized as an alternative to the voltage comparators. Those skilled in the art will envision many other possible variations that are within the scope and spirit of the invention as defined by the claims appended hereto.

What is claimed is:

1. An image sensing device, comprising:
    an image sensor array having a plurality of imager cells arranged in at least one row and a plurality of columns, with an imager cell of any given column being coupled to a column data line of that column; and
    analog to digital (A/D) conversion circuitry coupled to said column data lines, and operative to convert signals on said column data lines to digitized outputs at a varying resolution, said resolution being a function of signal amplitude.

2. The image sensing device of claim 1 wherein said varying resolution is such that higher resolution is provided for signals corresponding to dark light levels than for bright light levels.

3. An image sensing device, comprising:
    an image sensor array having a plurality of imager cells arranged in at least one row and a plurality of columns, with an imager cell of any given column being coupled to a column data line of that column;
    analog to digital (A/D) conversion circuitry coupled to said column data lines, and operative to convert signals on said column data lines to digitized outputs at a varying resolution, said resolution being a function of signal amplitude;
    wherein said A/D conversion circuitry comprises:
        at least one comparator having a first input coupled to at least one of said column data lines, and a second input coupled to receive a time varying reference signal;
        an n-bit counter coupled to an output of said comparator;
        an n-bit main counter that counts in synchronism with said n-bit counter;
        an n-bit to m-bit converter coupled to receive an output of said n-bit main counter, where m>n, said converter nonlinearly converting n-bit codes of said main counter to m-bit codes; and
        an m-bit digital to analog (D/A) converter coupled to said n-bit to m-bit converter for converting said m-bit codes to said time-varying reference signal.

4. The image sensing device of claim 3 wherein said image sensing array has N columns, said at least one comparator comprises N comparators, with each comparator having a first input connected to a corresponding column data line and a second input coupled to receive said time varying reference signal, and said device having N of said n-bit counters, each coupled to an output of one of said comparators.

5. The image sensing device of claim 3 wherein said n-bit to m-bit converter includes a look-up table stored in memory for mapping n-bit codes to m-bit codes.

6. The image sensing device of claim 3 wherein said time varying reference signal is a voltage.

7. The image sensing device of claim 3 wherein said time varying reference signal is a current.

8. The image sensing device of claim 1, wherein said A/D conversion circuitry comprises:
    at least one comparator having a first input coupled to at least one of said column data lines, and a second input coupled to receive a time varying reference signal;
    at least one m-bit counter coupled to an output of said comparator;
    an m-bit main counter that counts in synchronism with said m-bit counters;
    an m-bit digital to analog (D/A) converter for converting an output count of said main counter to said time varying reference signal; and
    an m-bit to n-bit converter, where m>n, coupled to receive an output of said m-bit counter, said converter nonlinearly mapping m-bit codes to n-bit codes in a manner such that higher resolution is provided for signals on said column data lines corresponding to dark light levels than for bright light levels.

9. The image sensing device of claim 8, wherein said image sensing array has N columns, said at least one comparator comprises N comparators, each having a first input coupled to one of said column data lines and a second input coupled to receive said time varying reference signal, said at least one m-bit counter comprises N counters, each coupled to an output of one of said comparators, and further comprising a multiplexer, coupled to outputs of said M counters, for providing a time multiplexed output to said m-bit to n-bit converter.

10. The image sensing device of claim 1 wherein said device includes CMOS circuitry.

11. The image sensing device of claim 1 wherein said A/D conversion circuitry comprises a non-uniform successive approximation A/D converter.

12. The image sensing device of claim 11, wherein said non-uniform successive-approximation A/D converter comprises:

a comparator for successively comparing an analog signal on one of said column data lines with a changing reference signal and providing a comparator output signal in accordance with the comparison;

an n-bit successive approximation register that successively modifies an n-bit output code thereof in accordance with said comparator output signal until a least significant digit of said n-bit code is resolved;

an n-bit to m-bit converter, where m>n, said n-bit to m-bit converter converting each n-bit code of said register to a corresponding m-bit code, said m-bit code being a nonlinear function of said n-bit code such that higher resolution is provided for dark light levels than for bright light levels; and an m-bit digital to analog converter for converting said m-bit code of said n-bit to m-bit converter to said changing reference signal;

whereby when said least significant bit is resolved, the n-bit code of said register represents a final approximation of said analog signal.

13. The image sensing device of claim 12, further comprising an n-bit shift register for shifting out the n-bit code of said successive approximation register once the least significant digit is resolved.

14. The image sensing device of claim 12, further including a multiplexer coupled between said column data lines and said comparator for time multiplexing the signals on said column data lines.

15. An image sensing device having correlated double sampling circuitry, said image device comprising:

a plurality of imager cells arranged in rows and columns, with the imager cells of any given column being coupled to a column data line of that column, and each imager cell being operable to selectively provide a first signal on an associated column data line indicative of a reset level during a first sampling interval and to provide a second signal on the associated column data line during a second sampling interval indicative of an amount of light incident upon that imager cell;

an n-bit unidirectional counter operative to count in one of an up or down direction during each of said first and second sampling intervals;

an n-bit to m-bit converter coupled to receive an output of said n-bit main counter, where m>n, said n-bit to m-bit converter nonlinearly mapping an n-bit count of said main counter to an m-bit count;

a digital to analog converter coupled to an output of said n-bit to m-bit converter, for converting the m-bit count to a reference signal that varies nonlinearly as a function of time, said reference signal varying nonlinearly during each of said first and second sampling intervals;

a plurality of comparators, each having a first input coupled to an associated one of said column data lines for receiving said first and second signals in the first and second sampling intervals, respectively, and a second input coupled to receive said time varying reference signal; and a plurality of n-bit up/down counters, each operable to count in a first direction during said first sampling interval and in an opposite direction during said second sampling interval, each of said up/down counters being responsive to an output of one of said comparators to stop counting during each of the first and second sampling intervals when the amplitude of the time varying reference signal substantially equals the amplitude of the respective first or second signal, whereby each said up/down counter provides an output representing a subtraction of one of said first or second signals from the other to complete a correlated double sampling operation.

16. The image sensor of claim 15, wherein said unidirectional counter is responsive to timing and control circuitry to count from a predetermined reference count to cause said time varying reference signal to nonlinearly ramp from a maximum level to a first lower level during the first sampling interval, said unidirectional counter being reset between the first and second sampling intervals, and counting during said second sampling interval to cause said time varying reference signal to nonlinearly ramp from said maximum level to a second level during the second sampling interval, said second level being lower than said first level.

17. The image sensor of claim 15, wherein each said comparator provides a logic level output to an associated one of said up/down counters, and each up/down counter being responsive to a predetermined state of said logic level output to stop counting.

18. A non-uniform successive-approximation analog to digital (A/D) converter, comprising:

a comparator for successively comparing an analog input signal with a changing reference signal;

an n-bit successive approximation register that successively modifies an n-bit output code thereof in accordance with an output signal of said comparator until a least significant digit of said n-bit code is resolved;

an n-bit to m-bit converter, where m>n, said n-bit to m-bit converter converting each n-bit code of said register to a corresponding m-bit code, said m-bit code being a nonlinear function of said n-bit code; and an m-bit digital to analog converter for converting said m-bit code of said n-bit to m-bit converter to said reference signal;

whereby when said least significant bit is resolved, the n-bit code of said register represents a final approximation of said analog signal.

19. The A/D converter of claim 18, further comprising an n-bit shift register for shifting out the n-bit code of said successive approximation register once the least significant digit is resolved.

20. The A/D converter of claim 18 wherein said n-bit to m-bit converter includes a look-up table stored in memory for mapping n-bit codes to m-bit codes.

* * * * *